United States Patent
Gaynes et al.

(10) Patent No.: US 8,008,122 B1
(45) Date of Patent: Aug. 30, 2011

(54) PRESSURIZED UNDERFILL CURE

(75) Inventors: Michael A. Gaynes, Vestal, NY (US);
Jae-Woong Nah, Closter, NJ (US);
Satoru Katsurayama, Tochigi Prefecture (JP)

(73) Assignees: International Business Machines Corporation, Armonk, NY (US);
Sumitomo Bakelite Co., Ltd., Tokyo (JP)

( * ) Notice: Subject to any disclaimer, the term of this patent is extended or adjusted under 35 U.S.C. 154(b) by 0 days.

(21) Appl. No.: 12/886,871

(22) Filed: Sep. 21, 2010

(51) Int. Cl.
*H01L 21/44* (2006.01)

(52) U.S. Cl. ........ 438/107; 438/108; 438/119; 257/686; 257/687; 257/738; 257/E21.499; 257/E21.508

(58) Field of Classification Search ............ 438/107, 438/108, 110, 119; 257/686, 687, 738, E21.499, 257/E21.508
See application file for complete search history.

(56) References Cited

U.S. PATENT DOCUMENTS

| | | | |
|---|---|---|---|
| 6,258,626 B1 * | 7/2001 | Wang et al. | 438/107 |
| 6,555,414 B1 * | 4/2003 | Vanfleteren et al. | 438/108 |
| 6,746,896 B1 | 6/2004 | Shi et al. | |
| 6,902,954 B2 | 6/2005 | Shi | |
| 2004/0080033 A1 * | 4/2004 | Fang | 257/678 |
| 2005/0196907 A1 * | 9/2005 | Ratificar et al. | 438/126 |
| 2007/0231952 A1 * | 10/2007 | Frutschy et al. | 438/106 |
| 2009/0032974 A1 * | 2/2009 | Farooq et al. | 257/778 |
| 2009/0293266 A1 * | 12/2009 | Zarbock et al. | 29/740 |

* cited by examiner

*Primary Examiner* — Hsien-ming Lee
(74) *Attorney, Agent, or Firm* — Scully, Scott, Murphy & Presser, P.C.; Louis J. Percello, Esq.

(57) ABSTRACT

To prevent formation of entrapped underfill material between solder balls and bonding bumps, fast temperature ramping is employed during a chi assembly after application of an underfill material prior to bonding. Voids formed within the underfill material are subsequently removed by curing the underfill material in a pressurized environment. Temperature cycling on the underfill material is limited during the bonding process in order to maintain viscosity of the underfill material prior to the cure process in the pressurized environment. Further, the underfill material is subjected to the pressurized environment until the cure process is complete to prevent re-formation of voids. The cure process can be a constant temperature or a multi-temperature process including temperature ramping. Further, the cure process can be a constant pressure process or a pressure cycling process that accelerates removal of the voids.

24 Claims, 21 Drawing Sheets

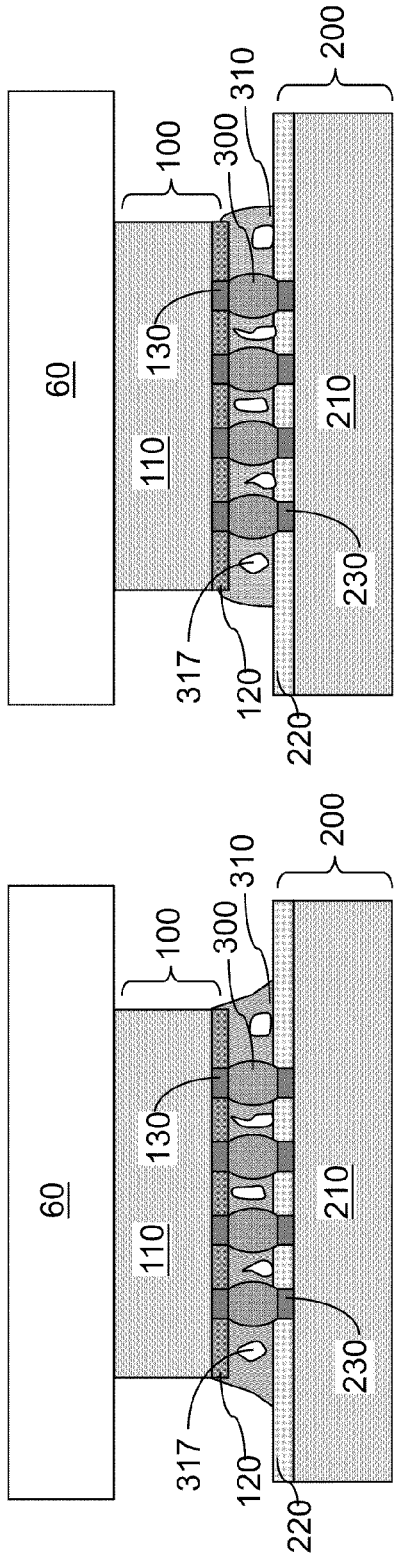
FIG. 2E
FIG. 2F
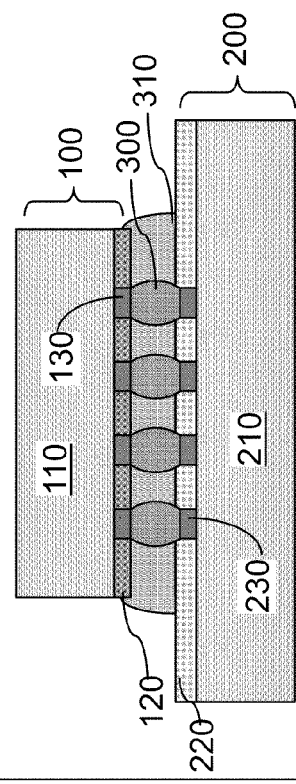
FIG. 2H
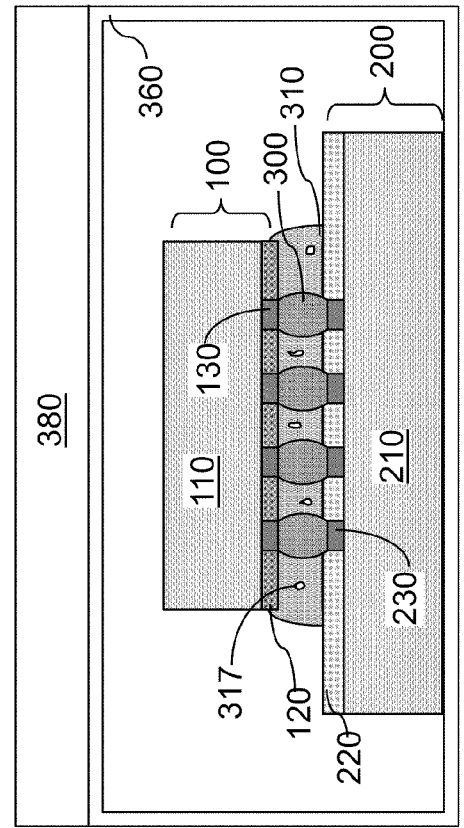
FIG. 2G

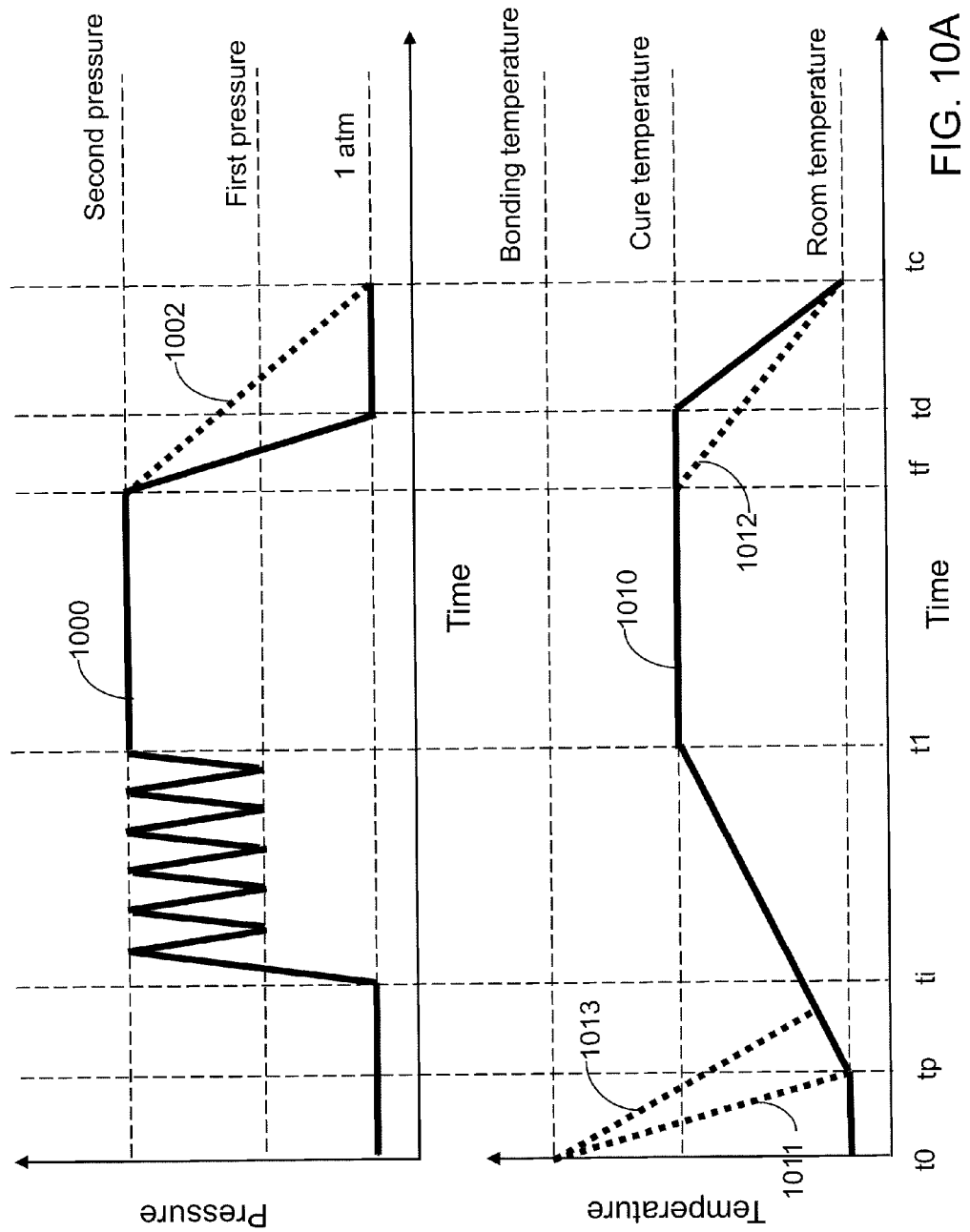

PRESSURIZED UNDERFILL CURE

BACKGROUND

The present disclosure relates to methods of curing underfill material, and particularly to methods of curing underfill material between a semiconductor chip and a substrate under a pressurized condition.

A semiconductor chip can be bonded to another semiconductor chip or a packaging substrate by employing Controlled Collapse Chip Connection (C4) process. Each C4 ball contacts a C4 pad on the semiconductor chip and another C4 pad on the other semiconductor chip or the packaging substrate. Each C4 pad is a contiguous metal pad typically formed out of the last metal layer of a metal interconnect structure during a semiconductor manufacturing sequence. Each C4 pad is large enough to accommodate the bottom portion of a C4 ball. Typically, an array of C4 balls can be employed to provide input/output (I/O) connections between the semiconductor chip and another semiconductor chip or a packaging substrate.

The C4 connections are susceptible to mechanical stress created by a mismatch in the coefficients of thermal expansion (CTE's) between the semiconductor chip and the other semiconductor chip or the packaging substrate. Such mechanical stress may cause cracks in the C4 balls or the semiconductor chip, causing the semiconductor chip to fail during usage. An underfill material, which easily deforms under stress, i.e., has a low value of Young's modulus, is employed to fill the space around the array of the C4 balls between the semiconductor chip and the other semiconductor chip or the packaging substrate. The underfill material absorbs the stress during the thermal expansion or contraction of the semiconductor chip, the array of C4 balls, and the other semiconductor chip or the packaging substrate, thereby preventing cracks in the bonded structure. In order to distribute the stress uniformly, however, it is necessary to have a uniform distribution of the underfill material without voids therein.

Recently, processes that apply the underfill material on a semiconductor chip or on a packaging substrate have been proposed. These processes enable filling spaces between an array of C4 balls with fewer and/or smaller cavities by applying the underfill material either on the substrate to which C4 balls are attached or to the other substrate to which C4 balls are not attached at the beginning of the bonding process. See, for example, U.S. Pat. No. 6,746,896 to Shi et al. and U.S. Pat. No. 6,902,954 to Shi.

One method is commonly referred to as the No Flow Underfill (NFU) method, in which the underfill material is pre-applied to a substrate. The other method is commonly referred to as the Wafer Level Underfill (WLU) method, in which the underfill material is pre-applied to a wafer, i.e., at least one semiconductor chip on a wafer. According to both methods, the pre-applied underfill material is cured in order to minimize the stress on low-k material layers in the semiconductor chip(s) during the flip chip assembly.

The pre-applied underfill material contains a fluxing component or flux capability in itself, and is subjected to the solder temperature, which is above the melting temperature of the solder material. For example, the melting temperature of lead-free solder is about 217° C. The relatively high soldering temperature causes large amounts of voids to form within the underfill material. The voids remain entrapped between the chip bumps on the semiconductor chip and the substrate bumps (or pads) on the substrate. The voids entrapped inside the underfill material are considered as a failure factor for the flip chip process because the areas including the voids do not absorb the mechanical stress. Further, some underfill material can be entrapped between a solder ball and a chip bump or a substrate bump, causing an electrical open.

On one hand, a low rate of temperature ramping can trigger an early cure of the underfill material, which minimizes formation of voids at the expense of maximizing entrapped underfill material between solder balls and the chip bumps or the substrate bumps during a flip chip bonding process. On the other hand, a high rate of temperature ramping can trigger a delayed cure of the underfill material, which minimizes formation of entrapped underfill materials between solder balls and the chip bumps or the substrate bumps voids at the expense of maximizing formation of voids due to aggressive reaction of underfill material during a flip chip bonding process. To date, a solution that reduces formation of entrapped underfill material on chip bumps or substrate bumps while reducing formation of voids in the underfill material has not been provided in the art.

BRIEF SUMMARY

To prevent formation of entrapped underfill material between solder balls and bonding bumps, fast temperature ramping is employed during a chip assembly after application of an underfill material prior to bonding. Voids formed within the underfill material are subsequently removed by curing the underfill material in a pressurized environment. Temperature cycling on the underfill material is limited during the bonding process in order to maintain viscosity of the underfill material prior to the cure process in the pressurized environment. Further, the underfill material is subjected to the pressurized environment until the cure process is complete to prevent re-formation of voids. The cure process can be a constant temperature or a multi-temperature process including temperature ramping. Further, the cure process can be a constant pressure process or a pressure cycling process that accelerates removal of the voids.

According to an aspect of the present disclosure, a method of bonding substrates is provided, which includes: applying an underfill material onto a surface of a first substrate; placing a second substrate on the underfill material, wherein an array of C4 balls is present between the first substrate and the second substrate; bonding the first substrate to the second substrate by heating the array of C4 balls to a reflow temperature of the array of C4 balls; and curing the underfill material at a cure temperature greater than room temperature and at a cure pressure greater than 1.0 atm after the bonding.

BRIEF DESCRIPTION OF THE SEVERAL VIEWS OF THE DRAWINGS

FIG. 1A is a CSAM picture after bonding and cool down to a room temperature, and FIG. 1B is a CSAM picture after a 2 hour long exposure to a 2 atm pressurized environment at room temperature.

FIGS. 2A-2H are sequential schematic vertical cross-sectional views of an exemplary structure illustrating a first method of bonding and curing substrates according to an embodiment of the present disclosure.

FIG. 4C is a CSAM picture after bonding and cool down to a room temperature, and FIG. 4D is a CSAM picture after a 2 hour long exposure to a 2 atm pressurized environment at 150° C.

FIG. 5C is a CSAM picture after bonding and cool down to a room temperature, and FIG. 5D is a CSAM picture after a combination of a first 1 hour long exposure to a 2 atm pressurized environment at 100° C. and a second 1 hour long exposure to a 2 atm pressurized environment at 150° C.

FIG. 5E is a CSAM picture after bonding and cool down to a room temperature, and FIG. 5F is a CSAM picture after a combination of a first 1 hour long exposure to a 2 atm pressurized environment at 125° C. and a second 1 hour long exposure to a 2 atm pressurized environment at 150° C.

FIG. 10A is a set of graphs illustrating conditions for a seventh cure process according to a seventh embodiment of the present disclosure.

DETAILED DESCRIPTION

Figure 1B:
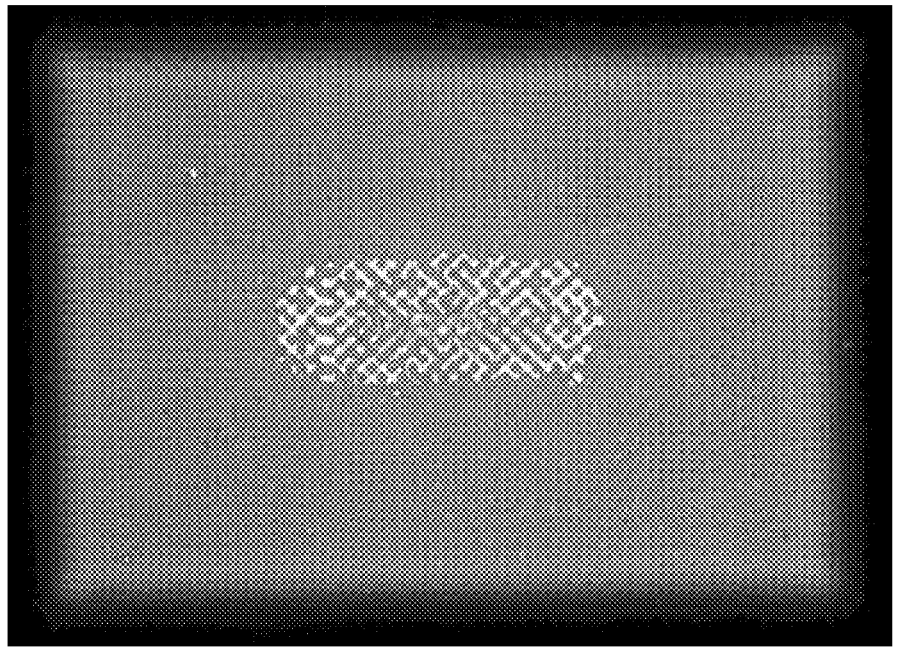
FIGS. 1A and 1B compare C-mode scanning acoustic microscopy (CSAM) pictures of an underfill material in a bonded chip assembly.

As stated above, the present disclosure relates to methods of curing underfill material between a semiconductor chip and a substrate under a pressurized condition, which are now described in detail with accompanying figures. It is noted that like and corresponding elements are referred to by like reference numerals. The drawings are not in scale.

Figure 1A:
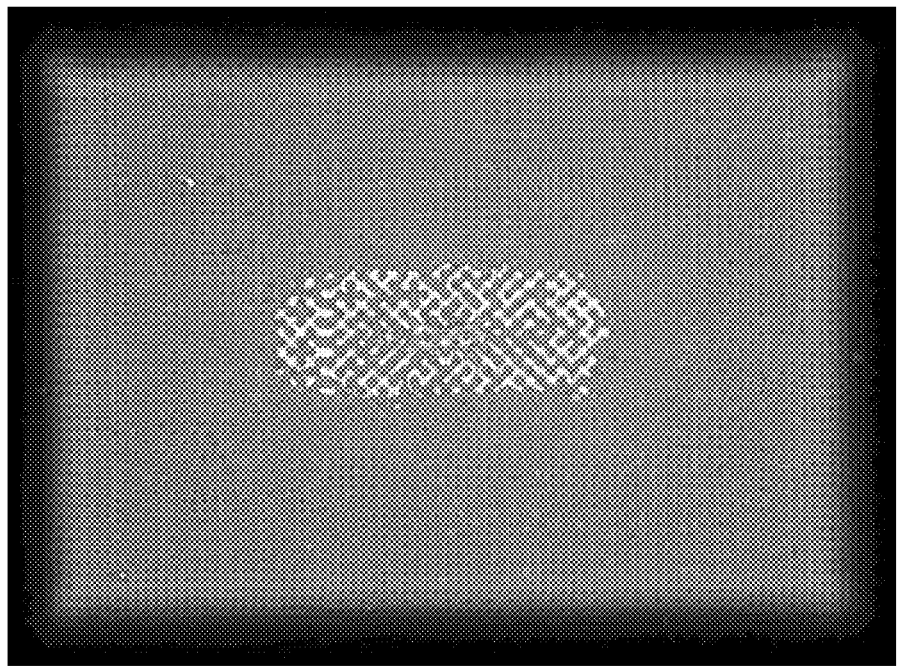

Referring to FIGS. 1A and 1B, C-mode scanning acoustic microscopy (CSAM) pictures are shown for an underfill material in a bonded chip assembly before and after a 2 hour long exposure to a 2 atm (atmospheric pressure) pressurized environment at room temperature. As used herein, "room temperature" refers to a continuous temperature range from 20° C. to 25° C. and including 20° C. and 25° C. FIG. 1A is the CSAM picture after bonding and cool down to room temperature and before the pressurized treatment at room temperature. The dark area represents regions in which a fill material is present without voids, and the white area represents regions in which voids are present. FIG. 1B is the CSAM picture after the pressurized treatment at room temperature. FIGS. 1A and 1B demonstrate that subjecting an underfill material including voids therein to a pressurized environment up to 2 atm at room temperature does not significantly reduce the voids, and is thus ineffective in removing the voids within the underfill material.

Referring to FIGS. 2A-2H, a first method of bonding substrates according to an embodiment of the present disclosure is sequentially illustrated. A first substrate 100 includes a first substrate layer 110 and a first surface dielectric layer 120. An array of first C4 pads 130 is formed on the first surface dielectric layer 120. An array of C4 balls 300 is attached to the array of first C4 pads 130 employing methods known in the art. Subsequently, a fill material is applied over the array of C4 balls 300 on a front surface, which is a bottom surface (as seen with the first substrate 100 upside down in FIG. 2A) of the first substrate 100, i.e., the exposed surface of the first surface dielectric layer 120. For example, the fill material can be over bump applied resin (OBAR) as known in the art, and the thickness of the fill material can be greater than the height of the array of C4 balls by an additional thickness from 5 microns to 50 microns. The first substrate 100 is then held upside down over a second substrate 200 by a bonder head 60.

The second substrate 200 includes a second substrate layer 210 and a second surface dielectric layer 220. An array of second C4 pads 230 are provided on the second surface dielectric layer 220. A solder material portion 240, which can have the same composition as the array of C4 balls 300, can be applied to each second C4 pad 230.

The first substrate 100 can be a semiconductor chip and the second substrate 200 can be a packaging substrate. Alternately, the first substrate 100 can be a packaging substrate and the second substrate 200 can be a semiconductor chip. Yet alternately, the first substrate 100 can be a first semiconductor chip and the second substrate 200 can be a second semiconductor chip. The relative sizes of the first substrate 100 and the second substrate 200 can vary, although the second substrate 200 is depicted to be larger in size than the first substrate 100 in FIGS. 2A-2H. The array of C4 balls 300 is bonded to the array of the first C4 pads 130, which are bond pads, located on the first substrate 100 prior to applying the underfill material 310 to the first substrate 100.

The second substrate 200 is placed under the first substrate 100 either by moving the first substrate 100 or by moving the second substrate 200. In one embodiment, the second substrate 200 can be directly mounted to a fixture, and the first substrate 100 may be mounted to the bonder head 60, which can move vertically and/or laterally by a movement actuator (not shown). Alternately or in conjunction, the second substrate 200 can be mounted in a way that enables lateral movement of the second substrate 200. The first substrate 100 and/or the second substrate 200 are moved relative to each other so that a C4 ball 300 directly overlies a corresponding solder material portion 240 and a corresponding second C4 pad 230. Any alignment scheme known in the art can be employed so that components in each pair of a C4 ball 300 and a corresponding second C4 pad overlie or underlie each other. A finite vertical spacing is maintained between the bottom surface of the underfill material 310 and the topmost surfaces of the solder material portions 240 until the alignment of the first and second substrates (100, 200) relative to each other is complete.

Figure 2A:
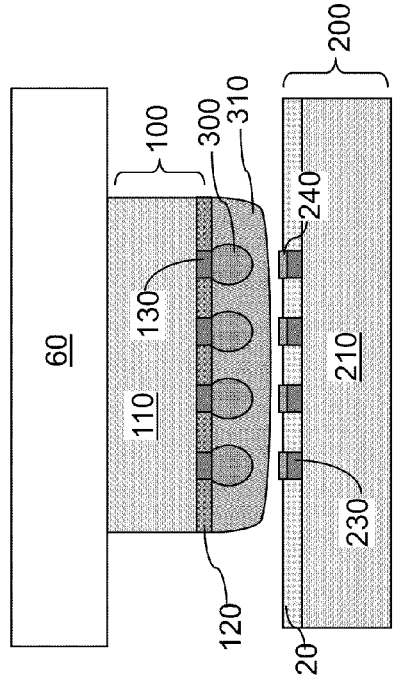
Figure 2B:
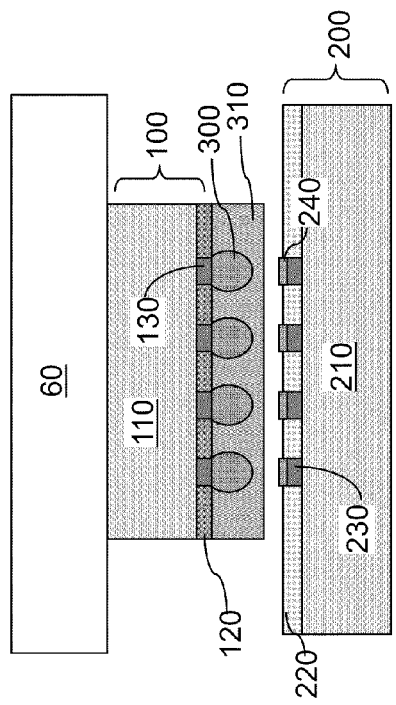

Referring to FIG. 2B, the array of C4 balls 300 is raised to an elevated temperature that does not exceed the melting temperature of the material of the C4 balls 300. The temperature of the array of C4 balls 300 can be raised by applying heat through the bonder head 60 to the first substrate 100, which transmits the heat to the array of C4 balls 300 and the underfill material 310. Alternately, the temperature of the array of C4 balls can be raised by any other means known in the art. As the temperature of the underfill material 310 increases, the outer surfaces of the underfill material may develop a convex shape due to a decrease in viscosity and the effect of surface tension.

Figure 2C:
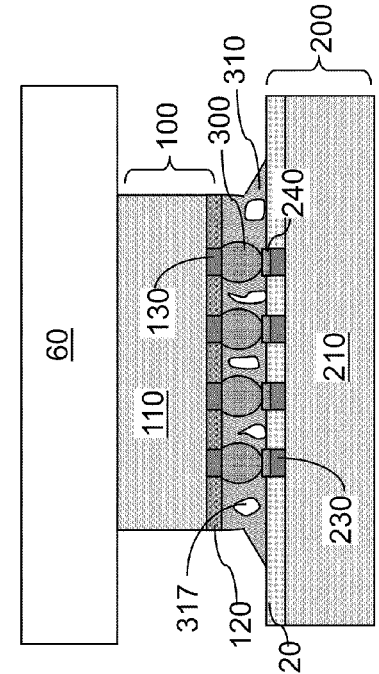

Referring to FIG. 2C, the first and second substrates (100, 200) are moved closer to each other until a surface of the underfill material 310 contacts the topmost surface of the second substrate 200. The relative movement of the first and second substrates (100, 200) can be effected by a vertical downward movement of the first substrate 100, a vertical upward movement of the second substrate 200, or a combination thereof. Initially, the array of C4 balls 300 does not make a contact with the solder material portions 240 located on the second substrate 200.

As the temperature of the underfill material 310 approaches the melting point of the solder material of the array of C4 balls 300, voids 317 from within the underfill material 310 because the fluxing component within the underfill material 310 decomposes and generates gas. The composition of fluxing components is described, for example, in U.S. Pat. No. 7,009,009 to Crane et al. By-products such as oxygen or water may be additionally generated through a reaction of reducing an oxide layer of the metal bumps. See, for example, U.S. Pat. No. 7,759,162 to Karashima et al. In addition, volatile gases from substrate may contribute to formation of voids 317 within the underfill material 310. For example, moisture absorption of semiconductor device affects the void generation. See U.S. Pat. No. 7,687,319 to Nishimura et al.

Figure 2D:
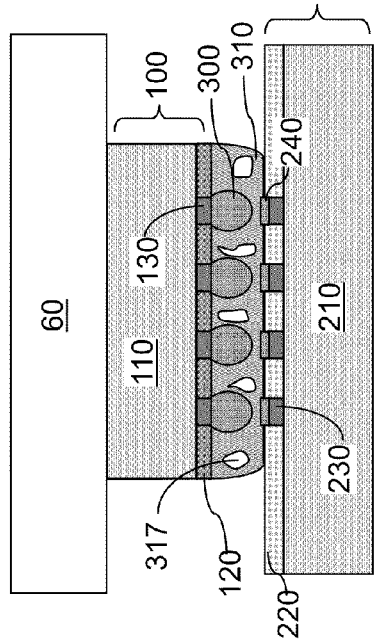

Referring to FIG. 2D, the first and second substrates (100, 200) are moved even closer to each other until the array of C4 balls 300 contact the second substrate 200, i.e., the solder material portions 240 of the second substrate 200.

Referring to FIG. 2E, after the array of C4 balls 300 contacts the second substrate 200, the array of C4 balls 300 is further heated to a reflow temperature of the solder material of the C4 balls 300. Upon heating of the array of C4 balls 300 to the reflow temperature of the solder material therein, the solder material of the C4 balls 300 and the solder material of the solder material portions 240 on the second substrate 200 begin to reflow, and the material of each solder material portion 240 is incorporated into a C4 ball 300. Upon reflow of the array of C4 balls 300, the first substrate 100 can be moved closer to the second substrate 200 to more effectively incorporate the material of the solder material portions 240 and to increase the solder bonding areas. The voids 317 may grow in size as the temperature of the underfill material 310 increases.

The processing steps of FIGS. 2B-2E can be performed in a continuous sequence in which the temperature of the underfill material 310 ramps up continuously. For example, the temperature of the array of C4 balls 300 can be ramped up at a rate between 10° C./sec and 100° C./sec from the melting temperature of the solder material of the array of C4 balls 300 to the reflow temperature during the bonding step of FIG. 2E. Further, the temperature of the array of C4 balls 300 can be ramped up at a rate between 10° C./sec and 100° C./sec from a temperature lower than the melting temperature of the solder material of the array of C4 balls 300, e.g., from room temperature or any temperature between room temperature and the melting temperature, to the reflow temperature during the bonding steps of FIGS. 2B-2E.

Referring to FIG. 2F, the first substrate 100 can be moved away from the second substrate 200 after the moving of the first substrate 100 closer to the second substrate 200 to provide an optimal and uniform shape for a fillet of the underfill material 310, i.e., for the portion of the underfill material 310 that laterally extrudes away from the sidewalls of the first substrate 100. Optionally, the first substrate 100 can be moved away from the second substrate 200 after the moving of the first substrate 100 closer to the second substrate 200 to provide an optimal and uniform shape for the solder joint 300. Thus, the first and second substrates (100, 200) are bonded through the array of C4 balls 310 and the underfill material 310.

The temperature of the underfill material 310 can be maintained at the reflow temperature for a time period during the processing steps of FIGS. 2G and 2F. The time period for maintaining the reflow temperature can be, for example, between 1 second and 3 seconds. The reflow temperature for a lead-free solder material can be about 250° C. Subsequently, the temperature of the underfill material 310 is ramped down at a relatively high temperature ramp rate, which can be between 10° C./sec and 30° C./sec from the reflow temperature to the melting temperature during the bonding. Further, the temperature of the underfill material 310 can be further ramped down to room temperature or a cure temperature, which is higher than room temperature and lower than the melting temperature of the solder material of the array of C4 balls 300. The combination of the relatively high temperature ramp up rate, the relatively short time period at the reflow temperature, and the relatively high temperature ramp down rate minimizes the exposure of the underfill material 310 to thermal treatment, and thereby minimizes curing of the underfill material due to the heat during the bonding steps of FIGS. 2B-2F.

At the end of the step of FIG. 2F, at least 15% of the underfill material 310 remains uncured. The percentage of the remaining uncured fraction of the underfill material 310 can be from 15% to 99%, and typically from 20% to 80%. The curing process changes the crosslink density and molecular weight distribution of the underfill material. Thus, the uncured fraction of the underfill material 310 can be analytically measured by determining the residual exotherm of the underfill material 310 at any stage of a curing process.

Referring to FIG. 2G, the bonded assembly of the first substrate 100 and the second substrate 200 is placed in an enclosure 360, which is provided with heating instrumentation 380. The enclosure 380 is a pressure chamber configured to enable pressurization therein with a range including at least 1 atm and 2 atm. The enclosure 380 can be configured to provide pressures greater than 2 atm. For example, the enclosure 380 can be configured to enable pressurization in a continuous pressure range including 1 atm and 25 atm, although pressurization at a greater pressure can be employed. The heating instrumentation 380 is an apparatus configured to provide heat within the enclosure 360, for example, by convection, conduction, radiation, or a combination thereof. For example, the assembly of the enclosure 360 and the heating instrumentation 380 can be a pressurized oven with electrical heaters, a thermostat mechanism, and a processor for temperature control.

Upon placement within the enclosure 360, the underfill material 310 is cured at a cure temperature greater than room temperature and at a cure pressure greater than 1.0 atm. A plurality of cure temperatures and/or a plurality of cure pressures can be employed. In general, the cure temperature(s) is/are less than the melting temperature of the solder material of the array of C4 balls 300. The cure pressure(s) is/are can be between 1.0 atm and 25 atm, although pressures greater 25 atm can be employed if the enclosure 380 supports operation at such pressures. The total volume of voids 317 in the underfill material 10 decreases during the curing of the underfill material 310 at the cure temperature(s) and the cure pressure(s).

Referring to FIG. 2H, the enclosure 360 is de-pressurized and the bonded assembly of the first substrate 100 and the second substrate 200 can be removed from inside the enclosure 360. The pressurized cure process removes the voids in the underfill material 310. At the end of the cure process, at least 90% of the underfill material 310 is cured before pressure applied to the underfill material is reduced from the cure pressure to 1.0 atm. Further, at least 99% of the underfill material 310 can be cured before pressure applied to the underfill material is reduced from the cure pressure to 1.0 atm. In practice, more than 99% of the underfill material 310 can be cured by the pressurized cure process if the temperature and the pressure are selected optimally.

Figure 3A:
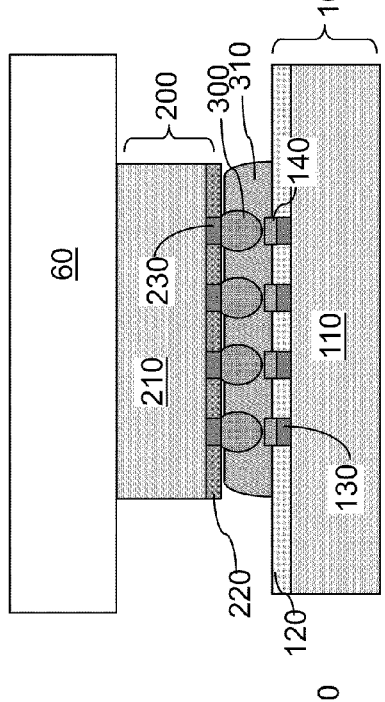
FIGS. 3A-3D are sequential schematic vertical cross-sectional views of another exemplary structure illustrating a second method of bonding and curing substrates according to another embodiment of the present disclosure.

Referring to FIGS. 3A-3D, a second method of bonding substrates according to another embodiment of the present disclosure is sequentially illustrated. Referring to FIG. 3A, a first substrate 100 includes a first substrate layer 110 and a first surface dielectric layer 120. An array of first C4 pads 130 is formed on the first surface dielectric layer 120. A solder material portion 140, which can have the same composition as an array of C4 balls 300 to be formed on a second substrate 200, can be applied to each first C4 pad 130.

The second substrate 200 includes a second substrate layer 210 and a second surface dielectric layer 220. An array of second C4 pads 230 are provided on the second surface dielectric layer 220. The array of C4 balls 300 is attached to the array of second C4 pads 230 employing methods known in the art. The second substrate 100 is then held upside down over the first substrate 100 by a bonder head 60.

A fill material 310 is applied over the first surface dielectric layer 120 and the solder material portions 140 located on the top surface of the first substrate 100. For example, the fill material 310 can be over bump applied resin (OBAR) as known in the art, and the thickness of the fill material 310 can be greater than the height of the array of C4 balls by an additional thickness from 5 microns to 50 microns.

The first substrate 100 can be a semiconductor chip and the second substrate 200 can be a packaging substrate. Alternately, the first substrate 100 can be a packaging substrate and the second substrate 200 can be a semiconductor chip. Yet alternately, the first substrate 100 can be a first semiconductor chip and the second substrate 200 can be a second semiconductor chip. The relative sizes of the first substrate 100 and the second substrate 200 can vary, although the first substrate 100 is depicted to be larger in size than the second substrate 200 in FIGS. 3A-3D. The array of C4 balls 300 is bonded to the array of second C4 pads 230, which are bond pads, located on the second substrate 200 prior to applying the underfill material 310 to the first substrate 100.

The first substrate 100 is placed under the second substrate 200 either by moving the second substrate 200 or by moving the first substrate 100. In one embodiment, the first substrate 100 can be directly mounted to a fixture, and the second substrate 200 may be mounted to the bonder head 60, which can move vertically and/or laterally by a movement actuator (not shown). Alternately or in conjunction, the first substrate 100 can be mounted in a way that enables lateral movement of the first substrate 100. The second substrate 200 and/or the first substrate 100 are moved relative to each other so that a C4 ball 300 directly overlies a corresponding solder material portion 140 and a corresponding first C4 pad 130. Any alignment scheme known in the art can be employed so that components in each pair of a C4 ball 300 and a corresponding first C4 pad 140 overlie or underlie each other. A finite vertical spacing is maintained between the bottom surface of the underfill material 310 and the topmost surfaces of the solder material portions 240 until the alignment of the second and first substrates (200, 100) relative to each other is complete.

Figure 3B:
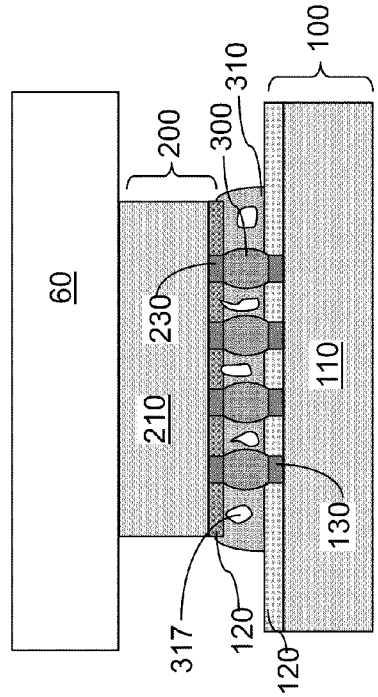

Referring to FIG. 3B, the array of C4 balls 300 is raised to an elevated temperature that does not exceed the melting temperature of the material of the C4 balls 300. The temperature of the array of C4 balls 300 can be raised by applying heat through the bonder head 60 to the first substrate 100, which transmits the heat to the array of C4 balls 300 and the underfill material 310. Alternately, the temperature of the array of C4 balls can be raised by any other means known in the art. At this step, the array of C4 balls 300 does not make a contact with the solder material portions 140 located on the first substrate 100.

Figure 3C:
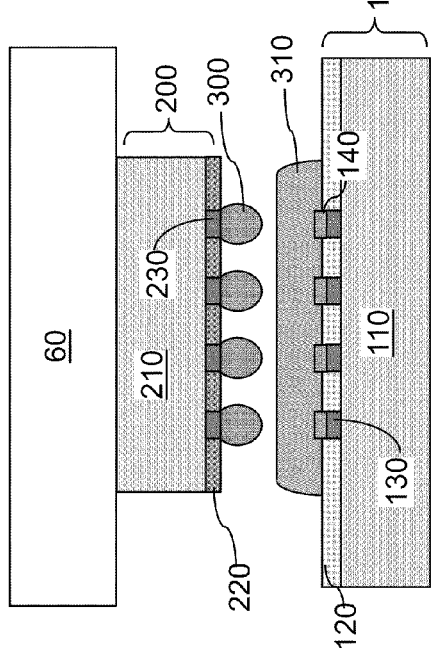

Referring to FIG. 3C, the first and second substrates (100, 200) are moved closer to each other until a surface of the underfill material 300 contacts the bottommost surface of the first substrate 100. The relative movement of the first and second substrates (100, 200) can be effected by a vertical downward movement of the first substrate 100, a vertical upward movement of the second substrate 200, or a combination thereof. As the temperature of the underfill material 310 approaches the melting point of the solder material of the array of C4 balls 300, voids 317 form within the underfill material 310 for the reasons discussed above in the first method of bonding substrates. The first and second substrates (100, 200) are moved even closer to each other until the array of C4 balls 300 contact the first substrate 100, i.e., the solder material portions 140 of the first substrate 100. After the array of C4 balls 300 contact the first substrate 100, the array of C4 balls 300 is further heated to a reflow temperature of the solder material of the C4 balls 300. Upon heating of the array of C4 balls 300 to the reflow temperature of the solder material therein, the solder material of the C4 balls 300 and the solder material of the solder material portions 140 on the first substrate 100 begin to reflow, and the material of each solder material portion 140 is incorporated into a C4 ball 300. Upon reflow of the array of C4 balls 300, the second substrate 200 can be moved closer to the first substrate 100 to more effectively incorporate the material of the solder material portions 140 and to increase the solder bonding areas. The voids 317 may grow in size as the temperature of the underfill material 310 increases.

The processing steps corresponding to FIG. 3C can be performed in a continuous sequence in which the temperature of the underfill material 310 ramps up continuously. For example, the temperature of the array of C4 balls 300 can be ramped up at a rate between 10° C./sec and 100° C./sec from the melting temperature of the solder material of the array of C4 balls 300 to the reflow temperature. Further, the temperature of the array of C4 balls 300 can be ramped up at a rate between 10° C./sec and 100° C./sec from a temperature lower than the melting temperature of the solder material of the array of C4 balls 300, e.g., from room temperature or any temperature between room temperature and the melting temperature, to the reflow temperature during the bonding steps of FIG. 3B-3C.

Figure 3D:
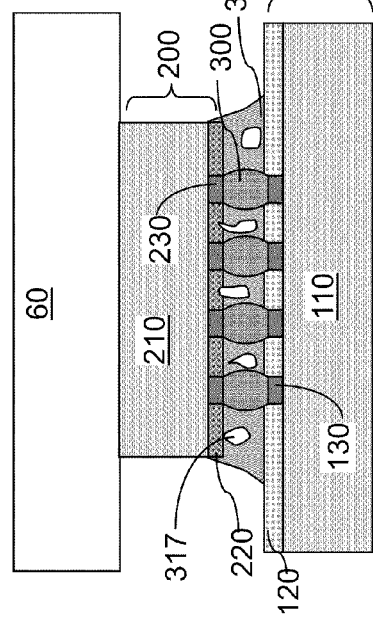

Referring to FIG. 3D, the second substrate 200 can be moved away from the first substrate 100 after the moving of the second substrate 200 closer to the first substrate 100 to provide an optimal and uniform shape for a fillet of the underfill material 310, i.e., for the portion of the underfill material 310 that laterally extrudes away from the sidewalls of the first substrate 100. Optionally, the first substrate 100 can be moved away from the second substrate 200 after the moving of the first substrate 100 closer to the second substrate 200 to provide an optimal and uniform shape for the solder joint 300. Thus, the first and second substrates (100, 200) are bonded through the array of C4 balls 310 and the underfill material 310.

The temperature of the underfill material 310 can be maintained at the reflow temperature for a time period during the processing steps of FIGS. 3C and 3D immediately after the temperature ramp up. The time period for maintaining the reflow temperature can be, for example, between 1 second and 3 seconds. Subsequently, the temperature of the underfill material 310 is ramped down at a relatively high temperature ramp rate, which can be between 10° C./sec and 30° C./sec from the reflow temperature to the melting temperature during the bonding. Further, the temperature of the underfill material 310 can be further ramped down to room temperature or a cure temperature, which is higher than room temperature and lower than the melting temperature of the solder material of the array of C4 balls 300. The combination of the relatively high temperature ramp up rate, the relatively short time period at the reflow temperature, and the relatively high temperature ramp down rate minimizes the exposure of the underfill material 310 to thermal treatment, and thereby minimizes curing of the underfill material due to the heat during the bonding steps of FIGS. 3B-3D.

At the end of the step of FIG. 3D, at least 15% of the underfill material 310 remains uncured. The percentage of the remaining uncured fraction of the underfill material 310 can be from 15% to 99%, and typically from 20% to 80%. The curing process changes the crosslink density and molecular weight distribution of the underfill material. Thus, the uncured fraction of the underfill material 310 can be analytically measured by determining the residual exotherm of the underfill material 310 at any stage of a curing process.

The processing steps of FIGS. 2G and 2H are subsequently employed to cure the assembly of the first substrate 100 and the second substrate 200 as in the first method of bonding substrates.

Figure 4A:
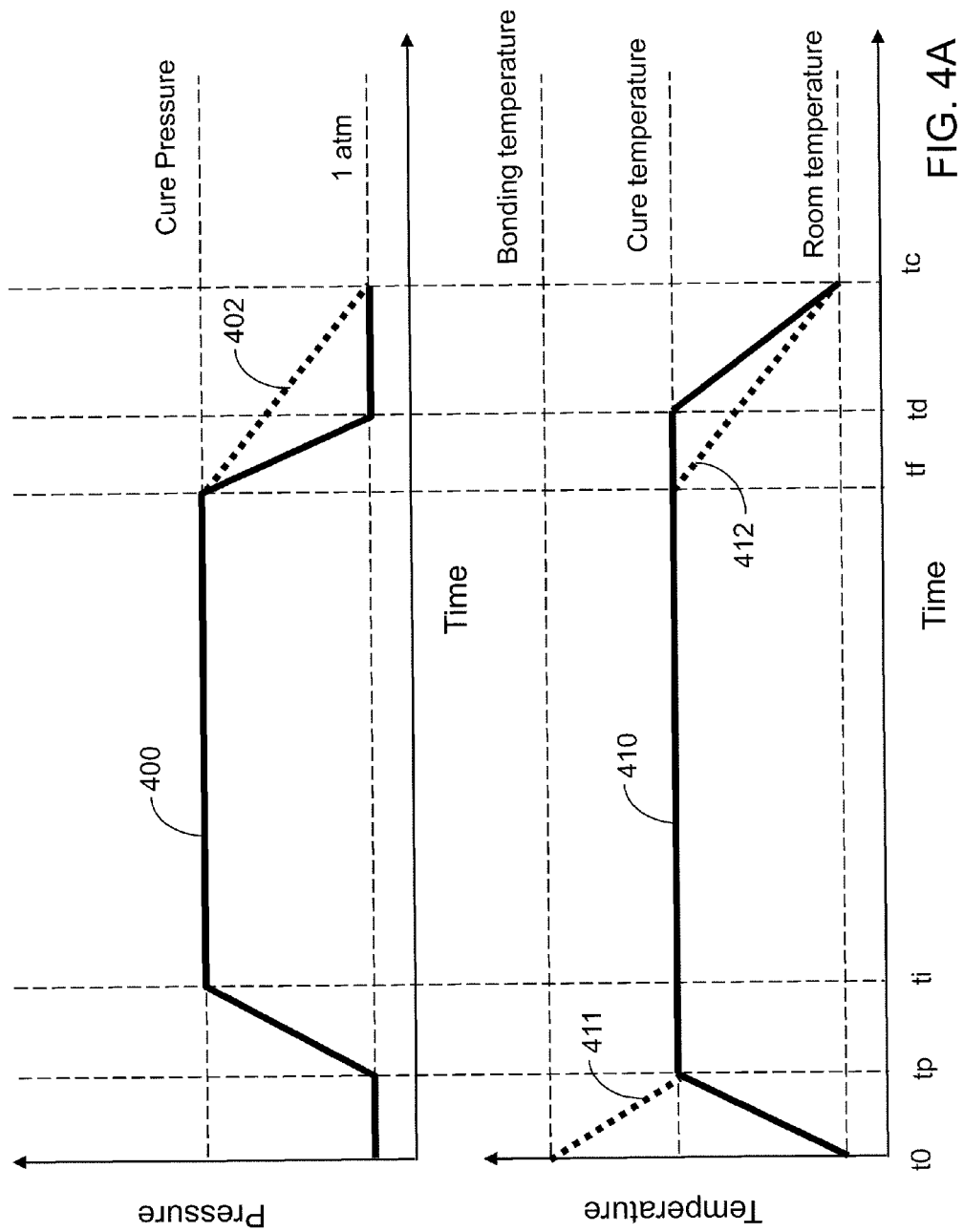
FIG. 4A is a set of graphs illustrating conditions for a first cure process according to a first embodiment of the present disclosure.

Referring to FIG. 4A, a set of graphs illustrate conditions for a first cure process according to a first embodiment of the present disclosure. At time t0, which is herein referred to as a process starting time, the temperature of an assembly of a first substrate 100 and a second substrate 200, as provided in FIG. 2F or in FIG. 3D, is placed in a pressurization chamber, which can be the enclosure 360 illustrated in FIG. 2G. Once the pressurization chamber is sealed, the assembly of the first substrate 100 and the second substrate 200 with an underfill material 310 and voids 317 is subjected processing conditions.

The pressure of the processing conditions is shown in a pressure curve 400, and the temperature of the processing conditions is shown in a temperature curve 410. The pressure of the processing conditions can be modified as shown in an alternate pressure curve 402, or any curve between the pressure curve 400 and the alternate pressure curve 402. The temperature of the processing conditions can be modified as shown in an alternate initial temperature curve 411 or any curve between the temperature curve 410 and the alternate initial temperature curve 411. In other words, the assembly of the first substrate 100 and the second substrate 200 can be placed within the pressurization chamber immediately after bonding or at any time after bonding before the assembly cools down to room temperature. Alternately, the bonding process may be performed within the pressurization chamber to obviate the need to transport the assembly (100, 200) to initiate the cure process. Further, the temperature of the processing conditions can also be modified as shown in an alternate terminal temperature curve 412 or any curve between the temperature curve 410 and the alternate terminal temperature curve 412.

The temperature of the assembly can be ramped from a starting temperature, which is the temperature at t0, to a cure temperature at a rate between 1° C./min and 50° C./min. The cure temperature depends on the composition of the underfill material, and is generally between 70° C. and 180° C., and typically between 90° C. and 160° C., although lower and higher temperatures can also be employed. The ambient gas in the pressurization chamber can be dried air, nitrogen, argon, or any other inert gas.

Once the temperature of the assembly reaches the cure temperature, pressurization of the pressurization chamber is initiated at time tp, which is herein referred to as a pressurization initiation time. While the temperature is maintained at the cure temperature, the pressure inside the pressurization chamber is ramped to a cure pressure, which is between 1.0 atm and 25 atm, although pressures exceeding 25 atm can also be employed. Typically, the cure pressure is between 1.0 atm and 10 atm. The ramp up rate during pressurization can be from 0.1 atm/min to 3 atm/min, although lesser and greater pressure ramp rates can also be employed.

At time ti, which is herein referred to as an initiation time, the pressure reaches the cure pressure. The processing conditions can be held steady until time tf, which is herein referred to as a finish time. The difference between the finish time and the initiation time is herein referred to as a steady state cure time period, which can be from 30 minutes to 24 hours, and typically from 1 hour to 3 hours, although lesser and greater time periods can also be employed.

At finish time tf, at least 15% of the underfill material 310 remains uncured. The percentage of the remaining uncured fraction of the underfill material 310 can be from 15% to 99%, and typically from 20% to 80%. The curing process changes the crosslink density and molecular weight distribution of the underfill material.

The pressurization chamber is depressurized after the finish time tf by ramping down the pressure to room temperature. The ramp down rate during pressurization can be from 0.1 atm/min to 3 atm/min, although lesser and greater pressure ramp rates can also be employed. The depressurization is completed at time td, which is herein referred to as a depressurization time.

The temperature can be ramped down after the depressurization time td or during any time period between the finish time tf and a time tc, which is herein referred to as a completion time. The processing conditions at the completion time tc is room temperature and 1 atm. The assembly of the first substrate 100 and the second substrate 200 can be removed from the pressurization chamber.

Figure 4B:
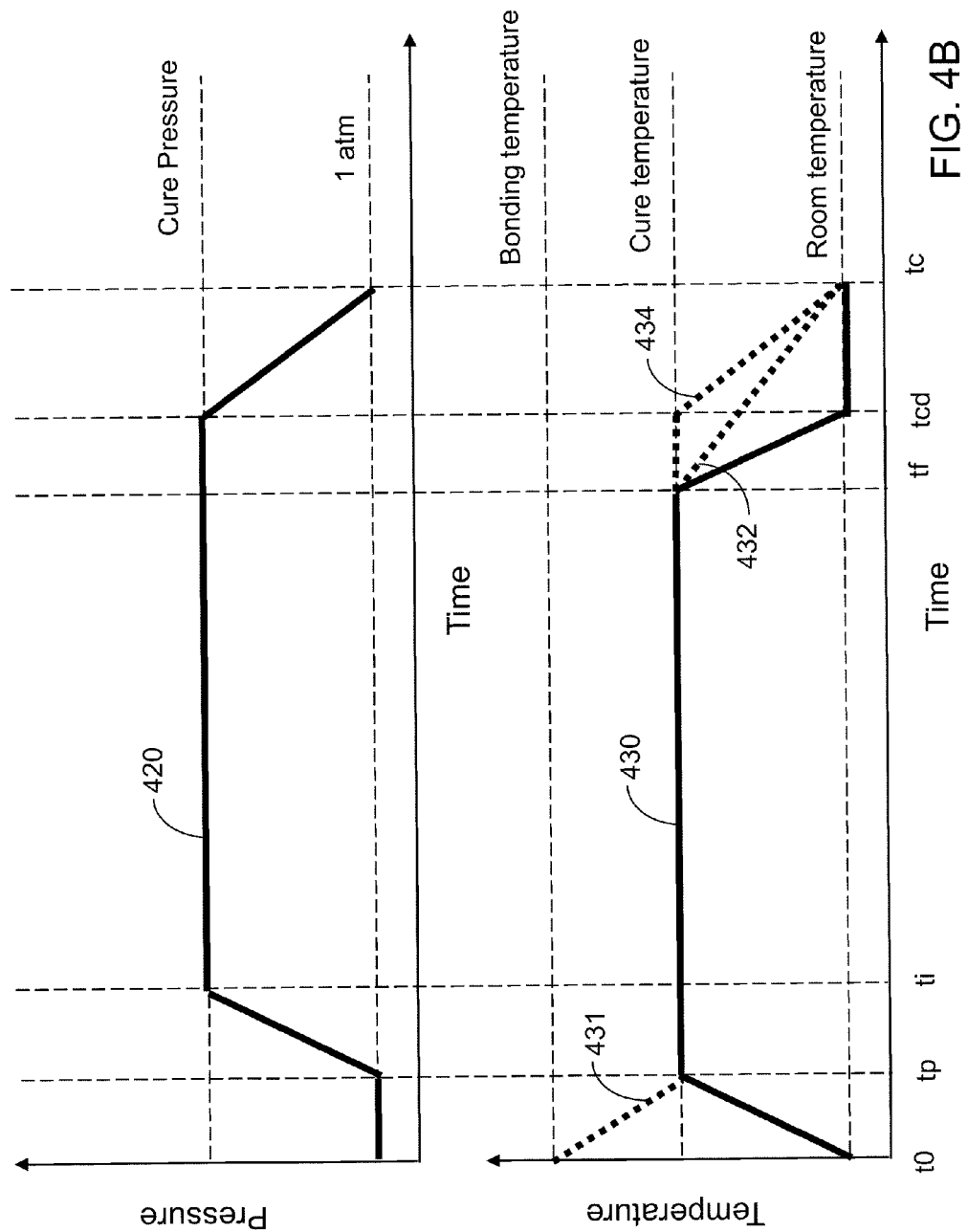
FIG. 4B is a set of graphs illustrating conditions for a variation of the first cure process according to the first embodiment of the present disclosure.

Referring to FIG. 4B, a set of graphs illustrate conditions for a variation of the first cure process according to the first embodiment of the present disclosure. The pressure of the processing conditions is shown in a pressure curve 420, and the temperature of the processing conditions is shown in a temperature curve 430. The temperature of the processing conditions can be modified as shown in an alternate initial temperature curve 431 or any curve between the temperature curve 430 and the alternate initial temperature curve 431. In other words, the assembly of the first substrate 100 and the second substrate 200 can be placed within the pressurization chamber immediately after bonding or at any time after bonding before the assembly cools down to room temperature. Alternately, the bonding process may be performed within the pressurization chamber to obviate the need to transport the assembly to initiate the cure process. Further, the temperature of the processing conditions can also be modified as shown in a first alternate terminal temperature curve 432, in a second alternate terminal temperature curve 434, or any curve between the temperature curve 430 and the second alternate terminal temperature curve 434. In this variation, the beginning of the cool down of the temperature precedes the beginning of the depressurization. The temperature of the assembly is cooled down to room temperature at time tcd, which is herein referred to as a end-of-cool-down time, which precedes, or is simultaneous with, the end of depressurization that occurs at the completion time tc.

Figure 4D:
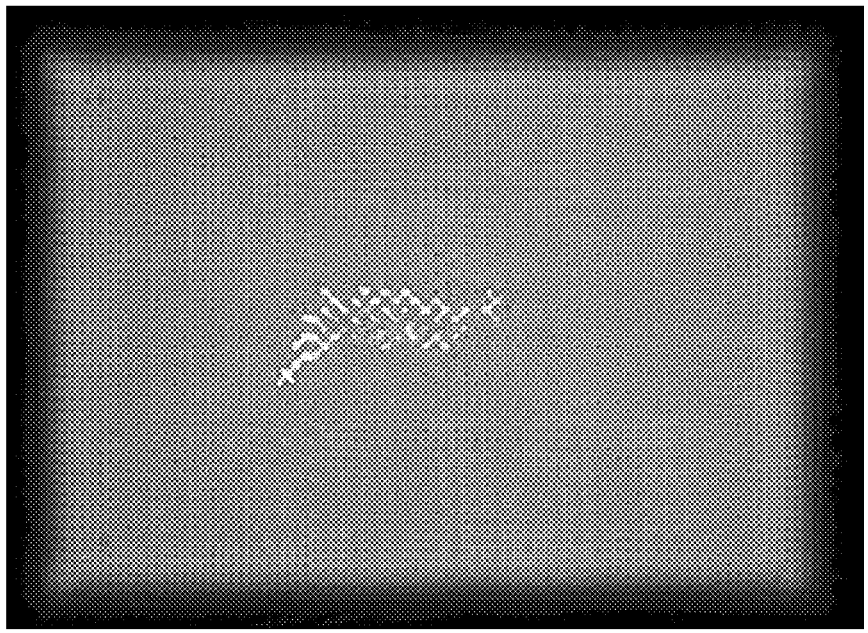
FIGS. 4C and 4D compare C-mode scanning acoustic microscopy (CSAM) pictures of an underfill material in a first bonded chip assembly.
Figure 4C:
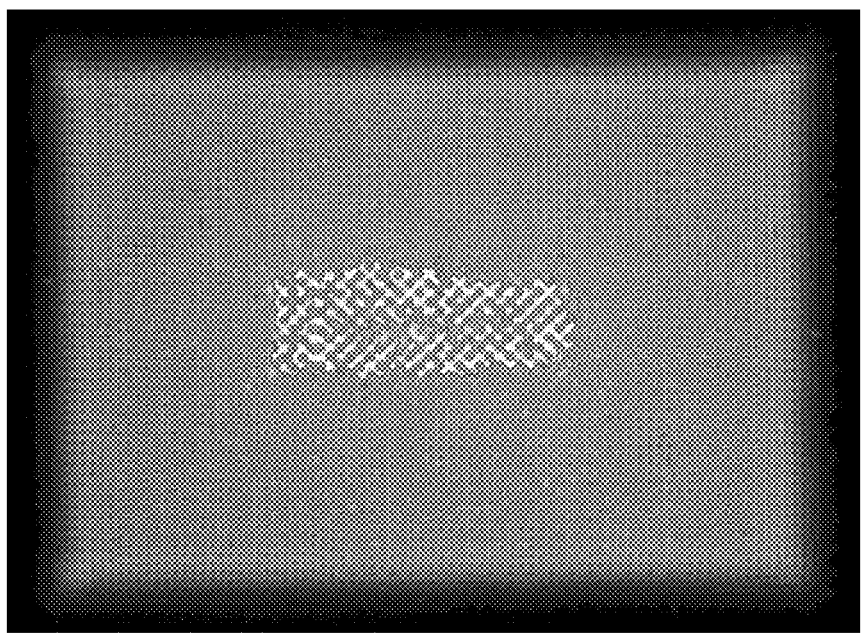

Referring to FIGS. 4C and 4D, C-mode scanning acoustic microscopy (CSAM) pictures are shown for an underfill material in a bonded chip assembly before and after a 2 hour long exposure to a 2 atm pressurized environment at 150° C. FIG. 4C is the CSAM picture after bonding and cool down to a room temperature and before the cure process employing pressurization at 150° C. FIG. 4D is the CSAM picture after the cure process employing pressurization. FIGS. 4C and 4D demonstrate that subjecting an underfill material including voids therein to a pressurized environment up to 2 atm at 150° C. significantly reduces the volume of the voids in the underfill material, and is thus effective in removing the voids within the underfill material.

Figure 5A:
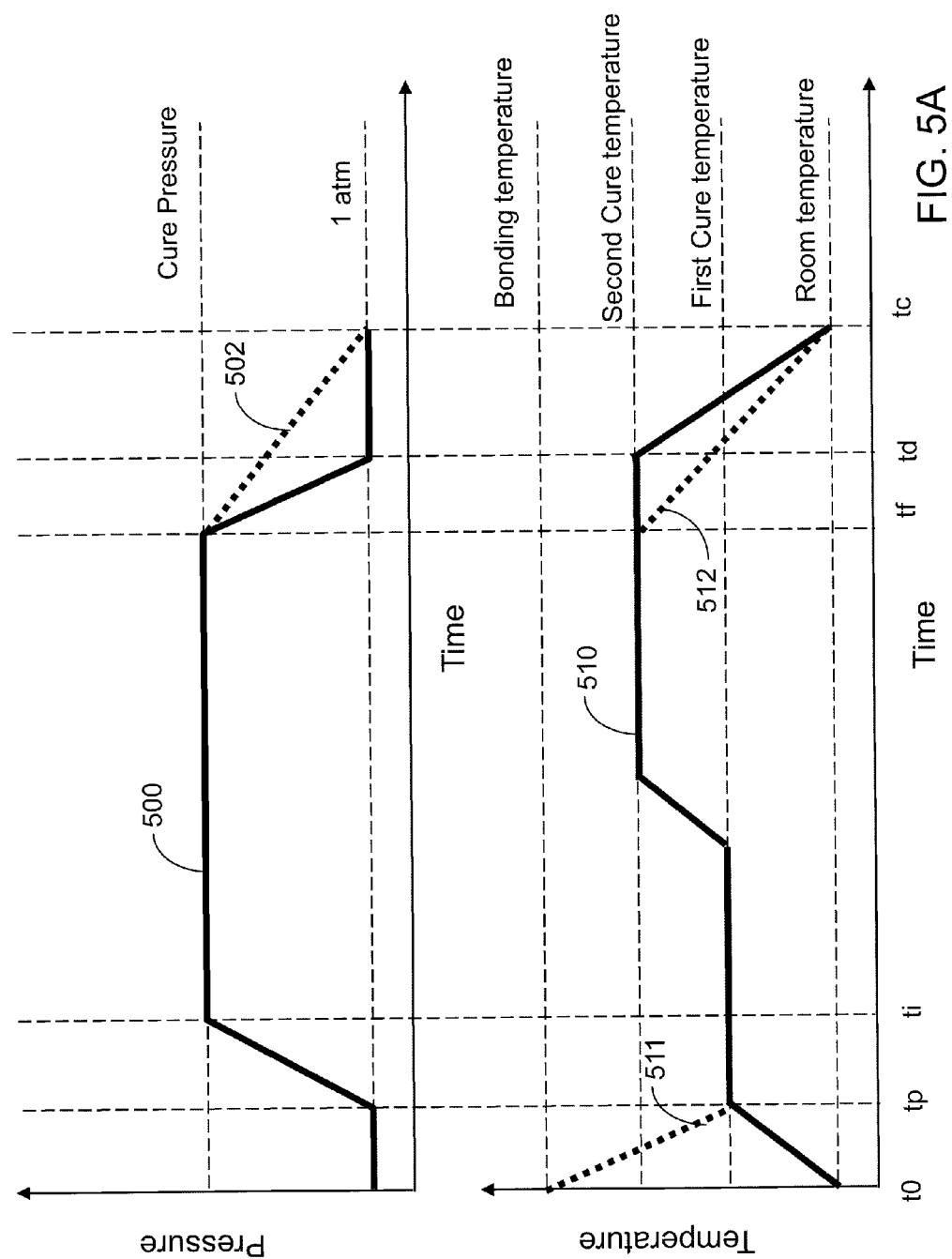
FIG. 5A is a set of graphs illustrating conditions for a second cure process according to a second embodiment of the present disclosure.

Referring to FIG. 5A, a set of graphs illustrate conditions for a second cure process according to a second embodiment of the present disclosure. The pressure of the processing conditions is shown in a pressure curve 500, and the temperature of the processing conditions is shown in a temperature curve 510. The temperature of the processing conditions can be modified as shown in an alternate initial temperature curve 511 or any curve between the temperature curve 510 and the alternate initial temperature curve 511. Further, the temperature of the processing conditions can also be modified as shown in an alternate terminal temperature curve 512 or any curve between the temperature curve 510 and the alternate terminal temperature curve 512. The pressure of the processing conditions can be modified as shown in an alternate pressure curve 502 or any curve between the pressure curve 500 and the alternate pressure curve 502.

In the second cure process, the single cure temperature employed in the first cure process is modified to include a plurality of cure temperatures with temperature ramps therebetween during pressurization. Thus, the underfill material is cured at a plurality of cure temperatures greater than room temperature that can be different from one another. For example, if the plurality of cure temperatures includes two cure temperatures, the two cure temperatures can be a first cure temperature and a second cure temperature. To cause more flow of the underfill material while the viscosity of the underfill material is higher, i.e., while a greater fraction of the underfill material remains uncured, the sequence of the plurality of cure temperatures can be selected so that curing steps at lower temperatures precede curing steps at higher temperatures.

Each of the plurality of cure temperatures depends on the composition of the underfill material, and can be generally between 70° C. and 180° C., and typically between 90° C. and 160° C., although lower and higher temperatures can also be employed. The ambient gas in the pressurization chamber can be dried air, nitrogen, argon, or any other inert gas. At finish time tf, at least 15% of the underfill material 310 remains uncured. The percentage of the remaining uncured fraction of the underfill material 310 can be from 15% to 99%, and typically from 20% to 80%. Other processing parameters can be substantially the same as in the first cure process.

Figure 5B:
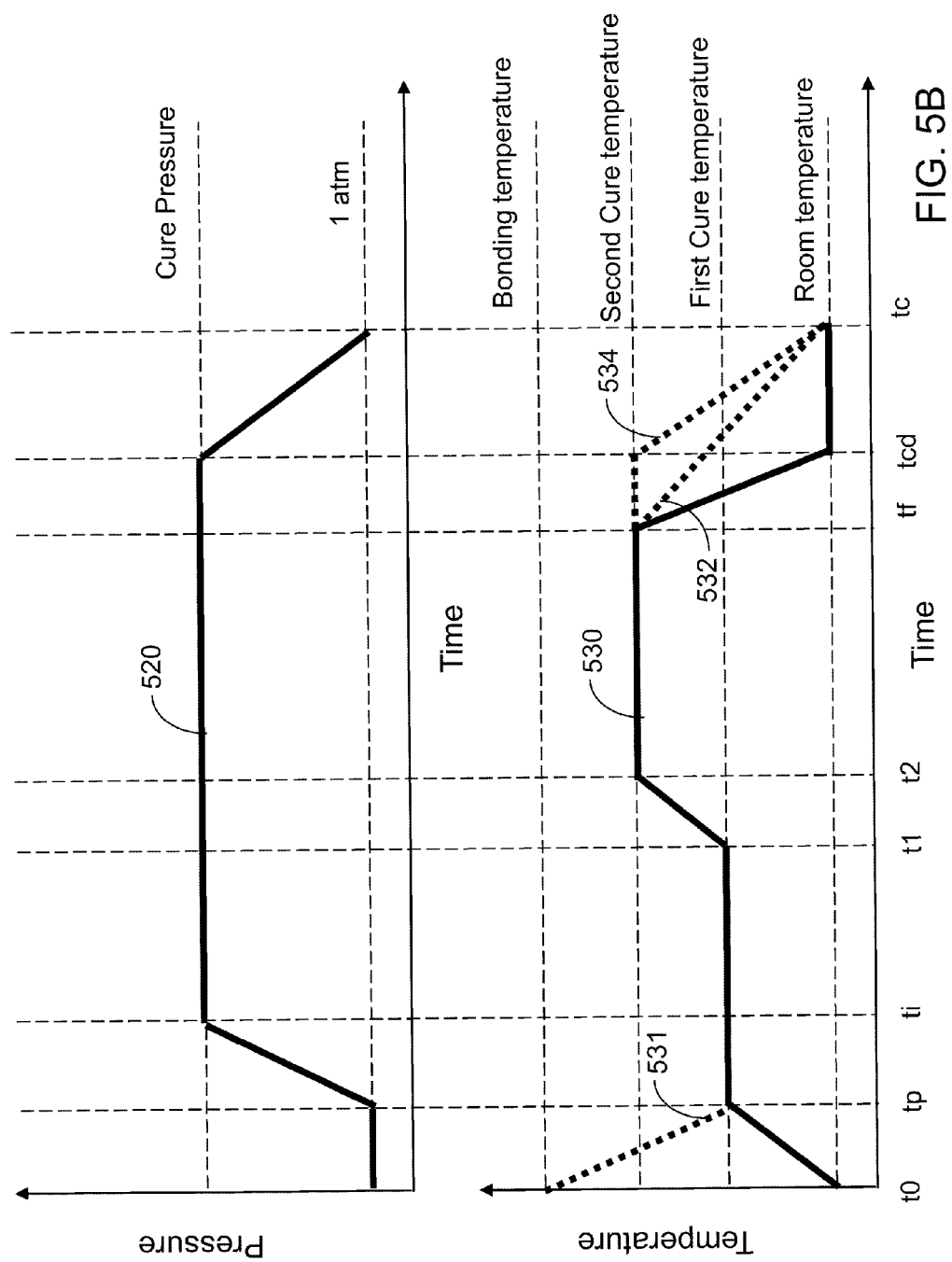
FIG. 5B is a set of graphs illustrating conditions for a variation of the second cure process according to the second embodiment of the present disclosure.

Referring to FIG. 5B, a set of graphs illustrate conditions for a variation of the second cure process according to the second embodiment of the present disclosure. The pressure of the processing conditions is shown in a pressure curve 520, and the temperature of the processing conditions is shown in a temperature curve 530. The temperature of the processing conditions can be modified as shown in an alternate initial temperature curve 531 or any curve between the temperature curve 530 and the alternate initial temperature curve 531. In other words, the assembly of the first substrate 100 and the second substrate 200 can be placed within the pressurization chamber immediately after bonding or at any time after bonding before the assembly cools down to room temperature. Alternately, the bonding process may be performed within the pressurization chamber to obviate the need to transport the assembly to initiate the cure process. Further, the temperature of the processing conditions can also be modified as shown in a first alternate terminal temperature curve 532, in a second alternate terminal temperature curve 534, or any curve between the temperature curve 530 and the second alternate terminal temperature curve 534.

Figure 5D:
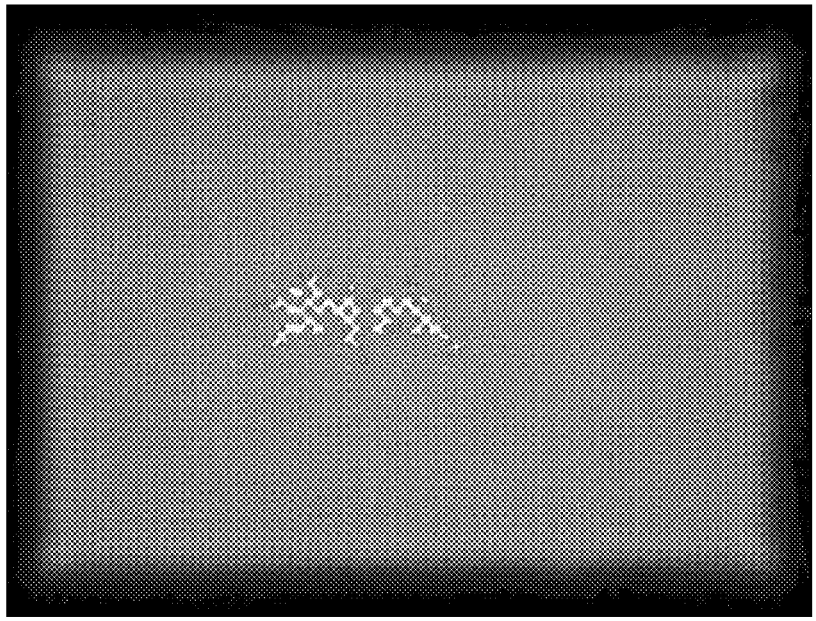
FIGS. 5C and 5D compare C-mode scanning acoustic microscopy (CSAM) pictures of an underfill material in a second bonded chip assembly.
Figure 5C:
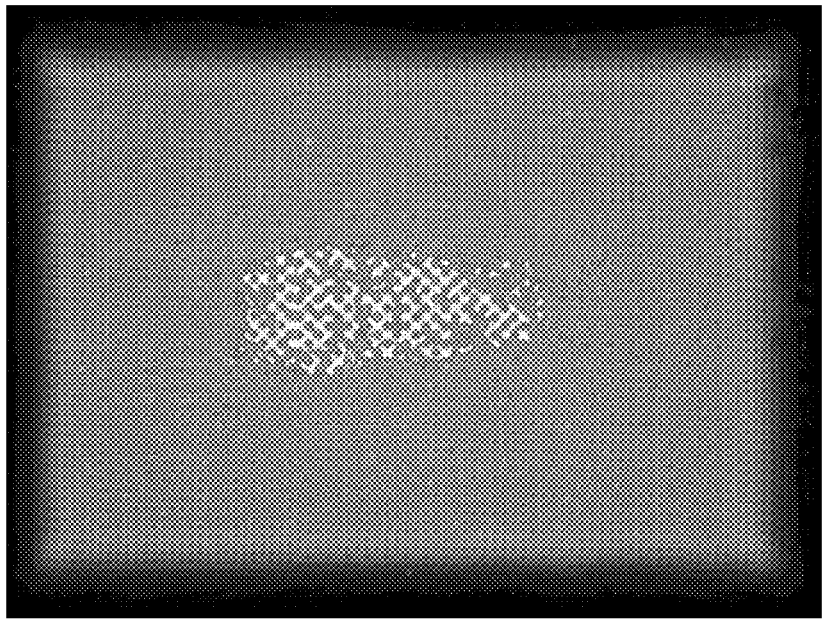

Referring to FIGS. 5C and 5D, CSAM pictures are shown for an underfill material in a bonded chip assembly before and after a multi-temperature cure process employing a 1 hour long exposure to a 2 atm pressurized environment at 105° C. followed by a 1 hour long exposure to a 2 atm pressurized environment at 150° C. FIG. 5C is the CSAM picture after bonding and cool down to a room temperature and before the multi-temperature cure process. FIG. 5D is the CSAM picture after the multi-temperature cure process. FIGS. 5C and 5D demonstrate that subjecting an underfill material including voids therein to this multi-temperature cure process significantly reduces the volume of the voids in the underfill material, and is thus effective in removing the voids within the underfill material.

Figure 5F:
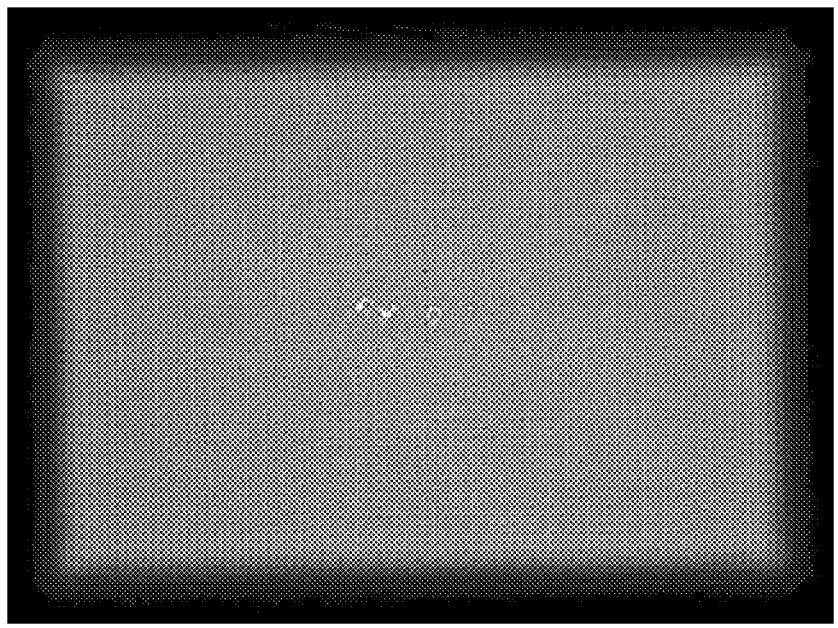
FIGS. 5E and 5F compare C-mode scanning acoustic microscopy (CSAM) pictures of an underfill material in a third bonded chip assembly.
Figure 5E:
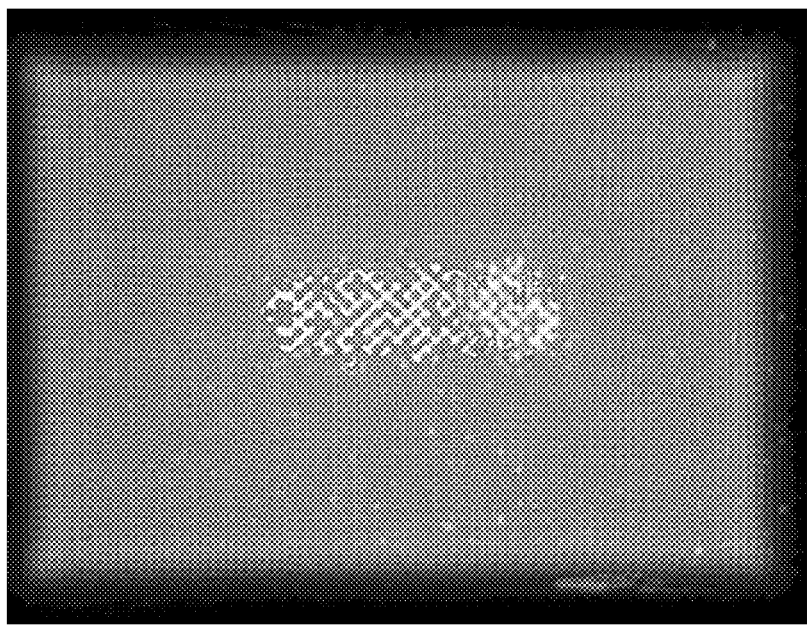

Referring to FIGS. 5E and 5F, CSAM pictures are shown for an underfill material in a bonded chip assembly before and after a multi-temperature cure process employing a 1 hour long exposure to a 2 atm pressurized environment at 125° C. followed by a 1 hour long exposure to a 2 atm pressurized environment at 150° C. FIG. 5E is the CSAM picture after bonding and cool down to a room temperature and before the multi-temperature cure process. FIG. 5F is the CSAM picture after the multi-temperature cure process. FIGS. 5E and 5F demonstrate that subjecting an underfill material including voids therein to this multi-temperature cure process almost eliminates the voids in the underfill material, and is thus effective in removing the voids within the underfill material.

Figure 6A:
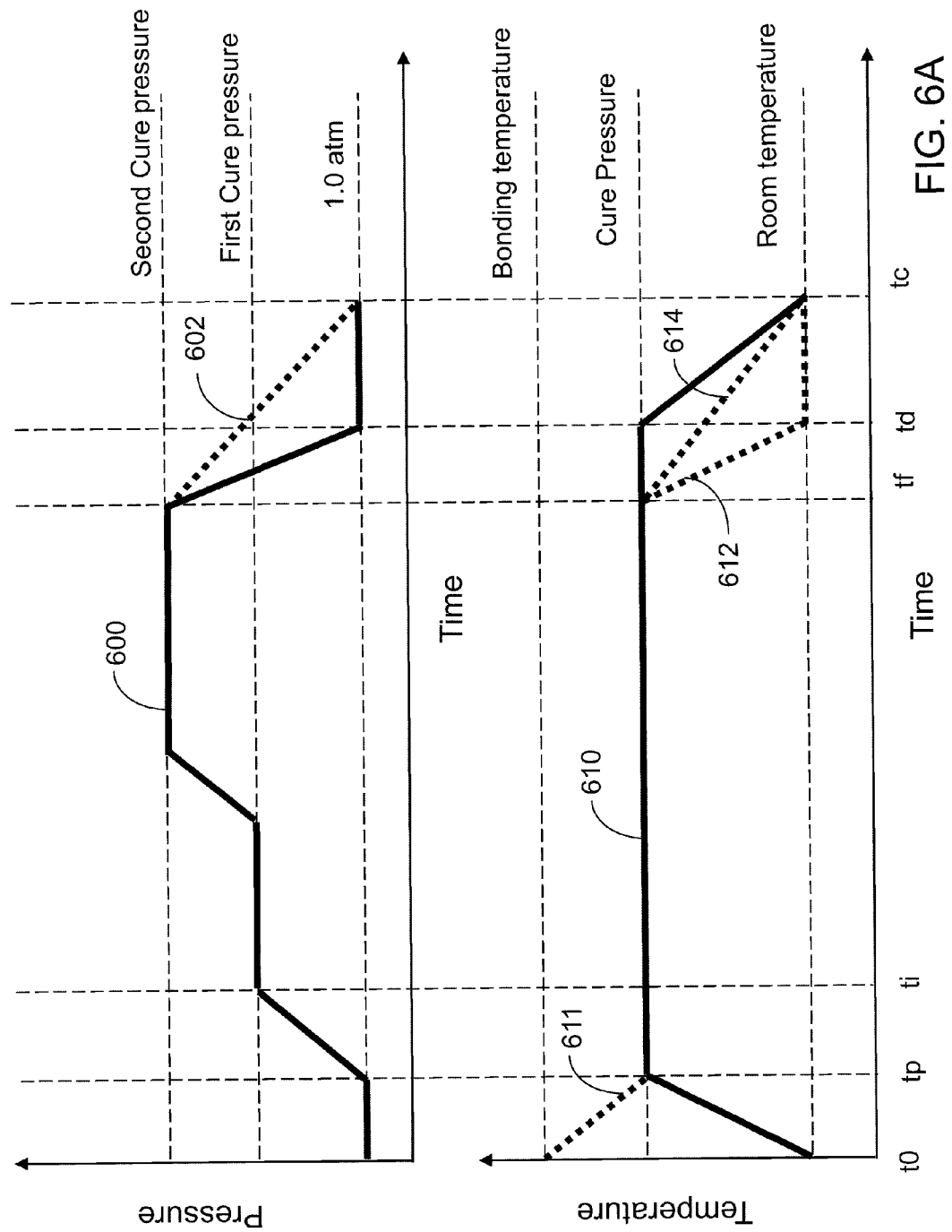
FIG. 6A is a set of graphs illustrating conditions for a third cure process according to a third embodiment of the present disclosure.

Referring to FIG. 6A, a set of graphs illustrate conditions for a third cure process according to a third embodiment of the present disclosure. The pressure of the processing conditions is shown in a pressure curve 600, and the temperature of the processing conditions is shown in a temperature curve 610.

The temperature of the processing conditions can be modified as shown in an alternate initial temperature curve 611 or any curve between the temperature curve 610 and the alternate initial temperature curve 611. Further, the temperature of the processing conditions can also be modified as shown in an alternate terminal temperature curve 612 or any curve between the temperature curve 610 and the alternate terminal temperature curve 612. The pressure of the processing conditions can be modified as shown in an alternate pressure curve 602 or any curve between the pressure curve 600 and the alternate pressure curve 602.

In the third cure process, the single cure pressure employed in the first cure process is modified to include a plurality of cure pressures with pressure ramps therebetween during pressurization. Thus, the underfill material is cured at a plurality of cure pressures greater than 1 atm. The plurality of cure pressures can be different from one another. For example, if the plurality of cure pressures includes two cure pressures, the two cure pressures can be a first cure pressure and a second cure pressure. To cause more flow of the underfill material while the viscosity of the underfill material is higher, the sequence of the plurality of cure pressures can be selected so that curing steps at lower pressures precede curing steps at higher pressures.

Each of the plurality of cure pressures depends on the composition of the underfill material, and can be generally between 1 atm and 25 atm, and typically between 1.5 atm and 10 atm, although higher pressures can also be employed. At finish time tf, at least 15% of the underfill material 310 remains uncured. The percentage of the remaining uncured fraction of the underfill material 310 can be from 15% to 99%, and typically from 20% to 80%. Other processing parameters can be substantially the same as in the first or second cure process.

Figure 6B:
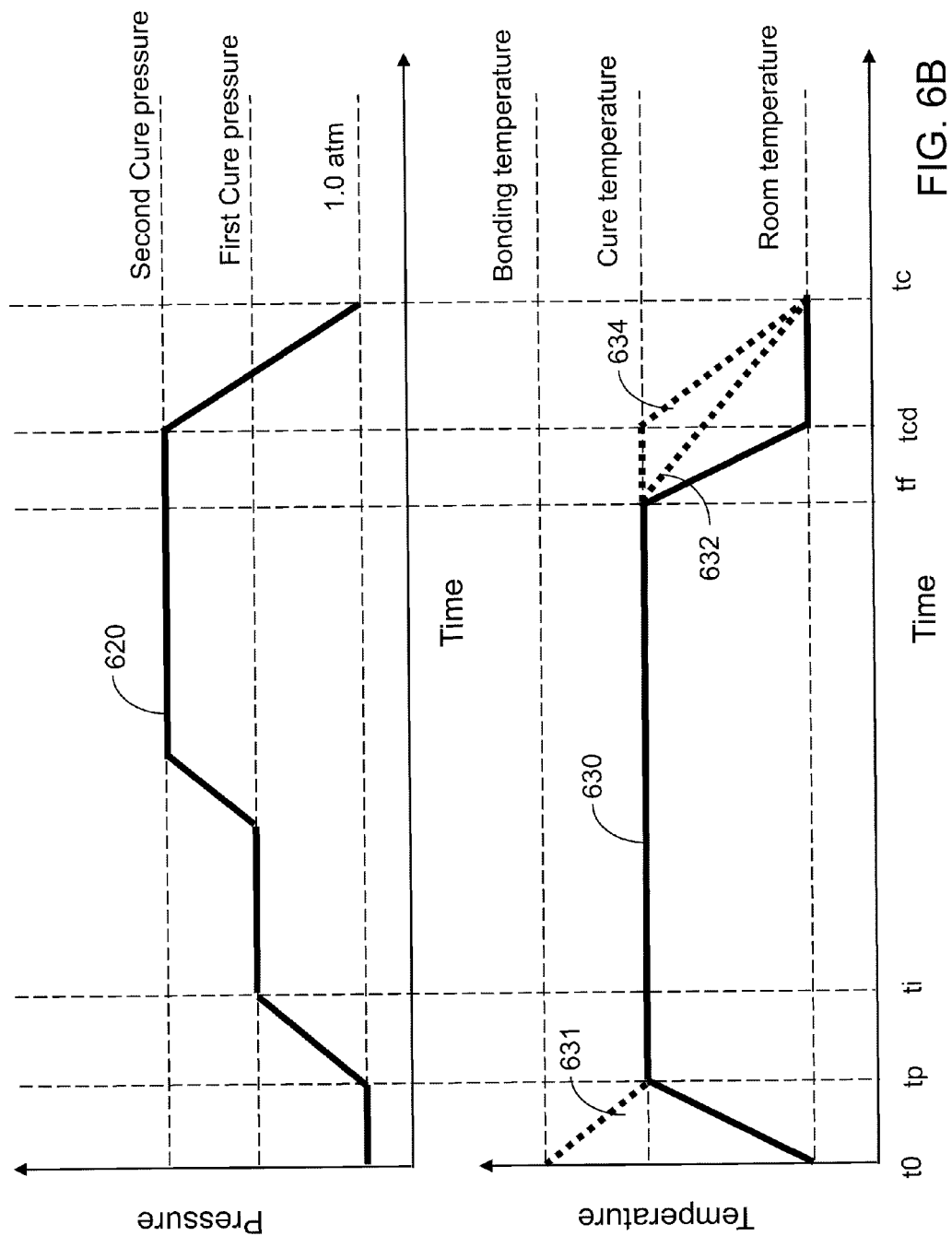
FIG. 6B is a set of graphs illustrating conditions for a variation of the third cure process according to the third embodiment of the present disclosure.

Referring to FIG. 6B, a set of graphs illustrate conditions for a variation of the third cure process according to the third embodiment of the present disclosure. The pressure of the processing conditions is shown in a pressure curve 620, and the temperature of the processing conditions is shown in a temperature curve 630. The temperature of the processing conditions can be modified as shown in an alternate initial temperature curve 631 or any curve between the temperature curve 630 and the alternate initial temperature curve 631. Further, the temperature of the processing conditions can also be modified as shown in a first alternate terminal temperature curve 632, in a second alternate terminal temperature curve 634, or any curve between the temperature curve 630 and the second alternate terminal temperature curve 634.

Figure 7A:
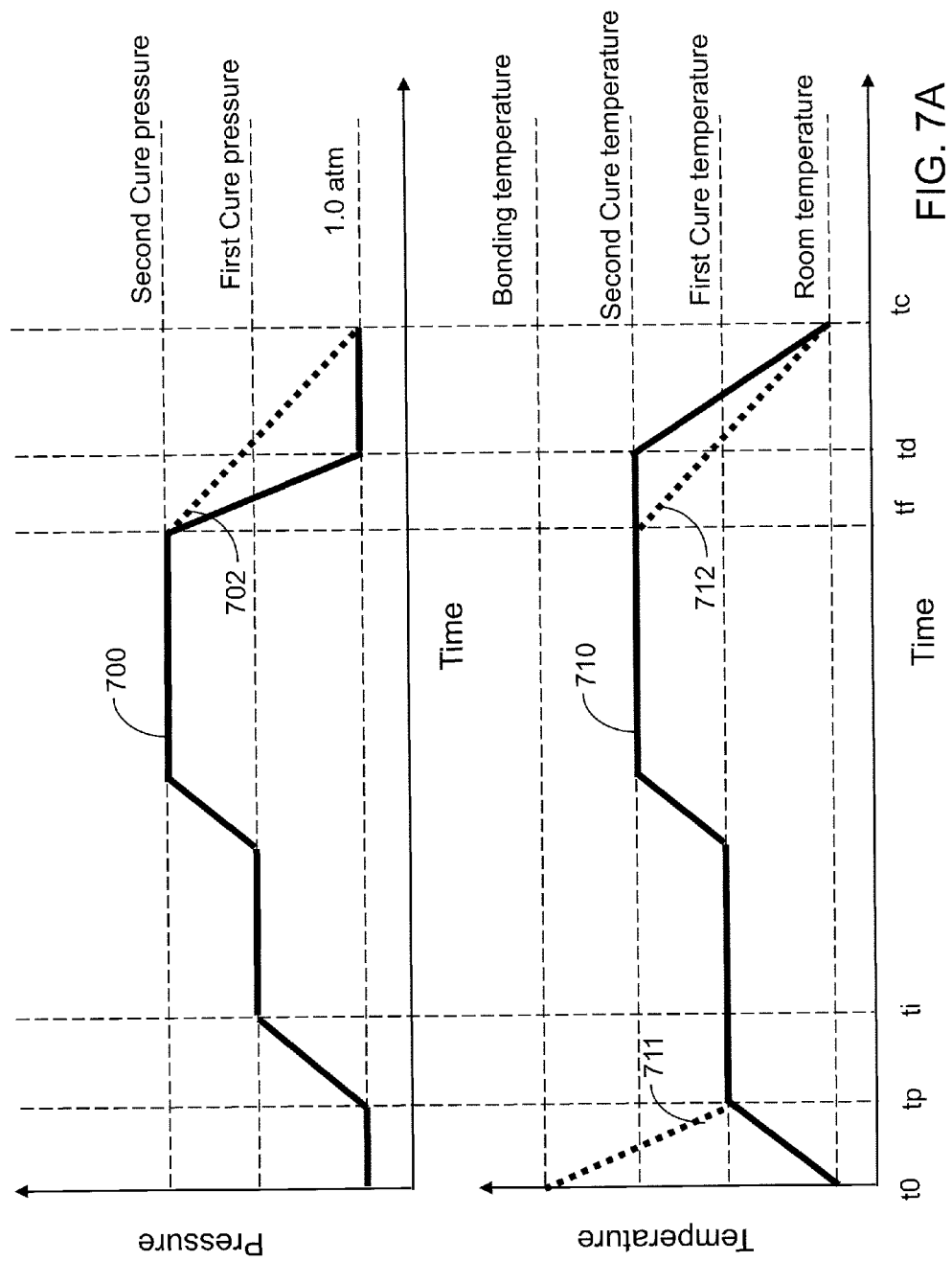
FIG. 7A is a set of graphs illustrating conditions for a fourth cure process according to a fourth embodiment of the present disclosure.
Figure 7B:
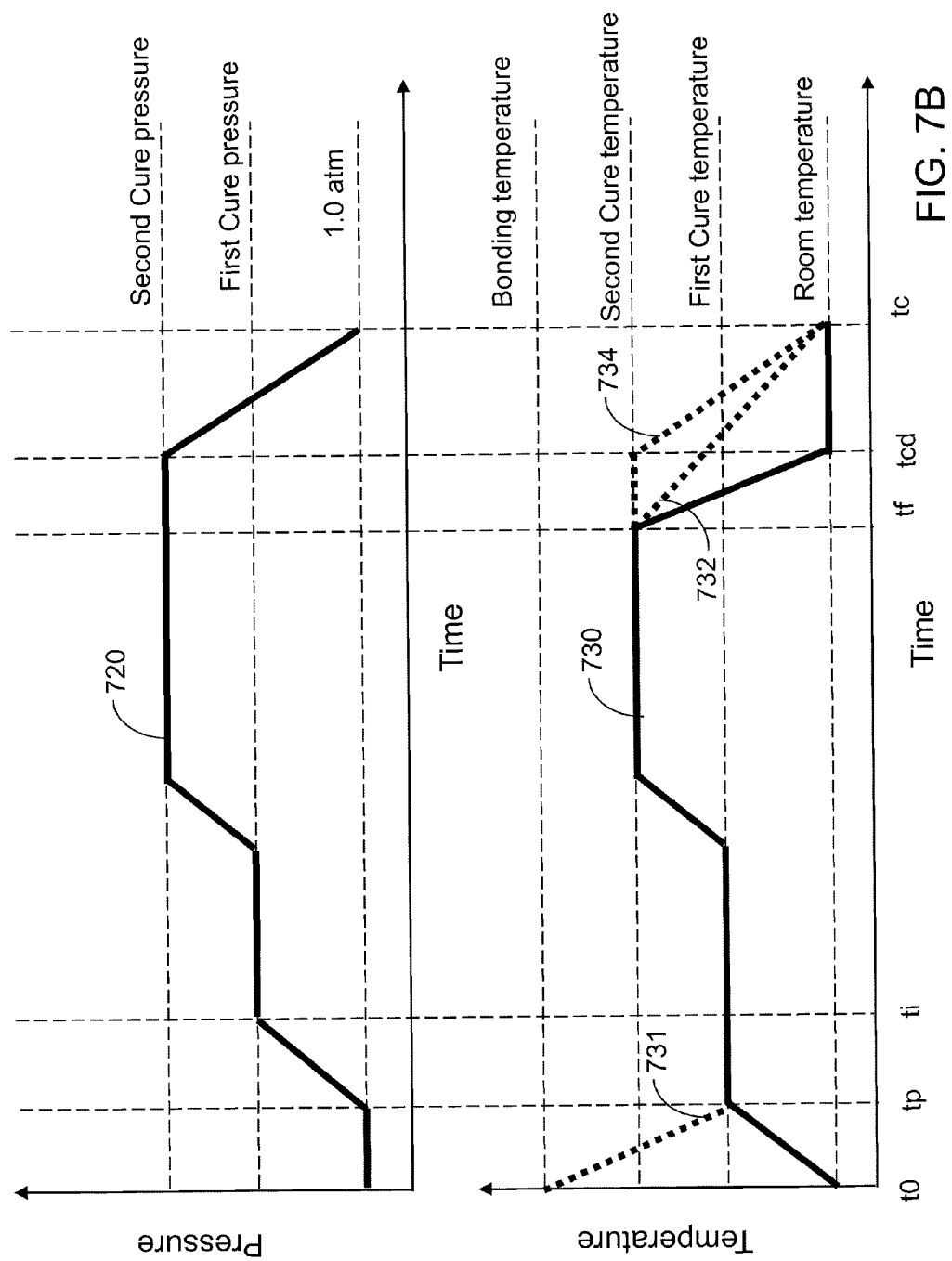
FIG. 7B is a set of graphs illustrating conditions for a variation of the fourth cure process according to the fourth embodiment of the present disclosure.

Referring to FIG. 7A, a set of graphs illustrate conditions for a fourth cure process according to a fourth embodiment of the present disclosure. The pressure of the processing conditions is shown in a pressure curve 700, and the temperature of the processing conditions is shown in a temperature curve 710. The temperature of the processing conditions can be modified as shown in an alternate initial temperature curve 711 or any curve between the temperature curve 710 and the alternate initial temperature curve 711. Further, the temperature of the processing conditions can also be modified as shown in an alternate terminal temperature curve 712 or any curve between the temperature curve 710 and the alternate terminal temperature curve 712. The pressure of the processing conditions can be modified as shown in an alternate pressure curve 702 or any curve between the pressure curve 700 and the alternate pressure curve 702.

In the fourth cure process, the single cure temperature employed in the first cure process is modified to include a plurality of cure temperatures with temperature ramps therebetween during pressurization as in the second cure process described above. Thus, the underfill material is cured at a plurality of cure temperatures greater than room temperature that can be different from one another. Further, the single cure pressure employed in the first cure process is modified to include a plurality of cure pressures with pressure ramps therebetween during pressurization as in the third cure process described above. Thus, the underfill material is cured at a plurality of cure pressures greater than 1 atm. The plurality of cure pressures can be different from one another. The transition time between different cure temperatures and the transition time between different cure pressures can be coincident or different.

Figure 8A:
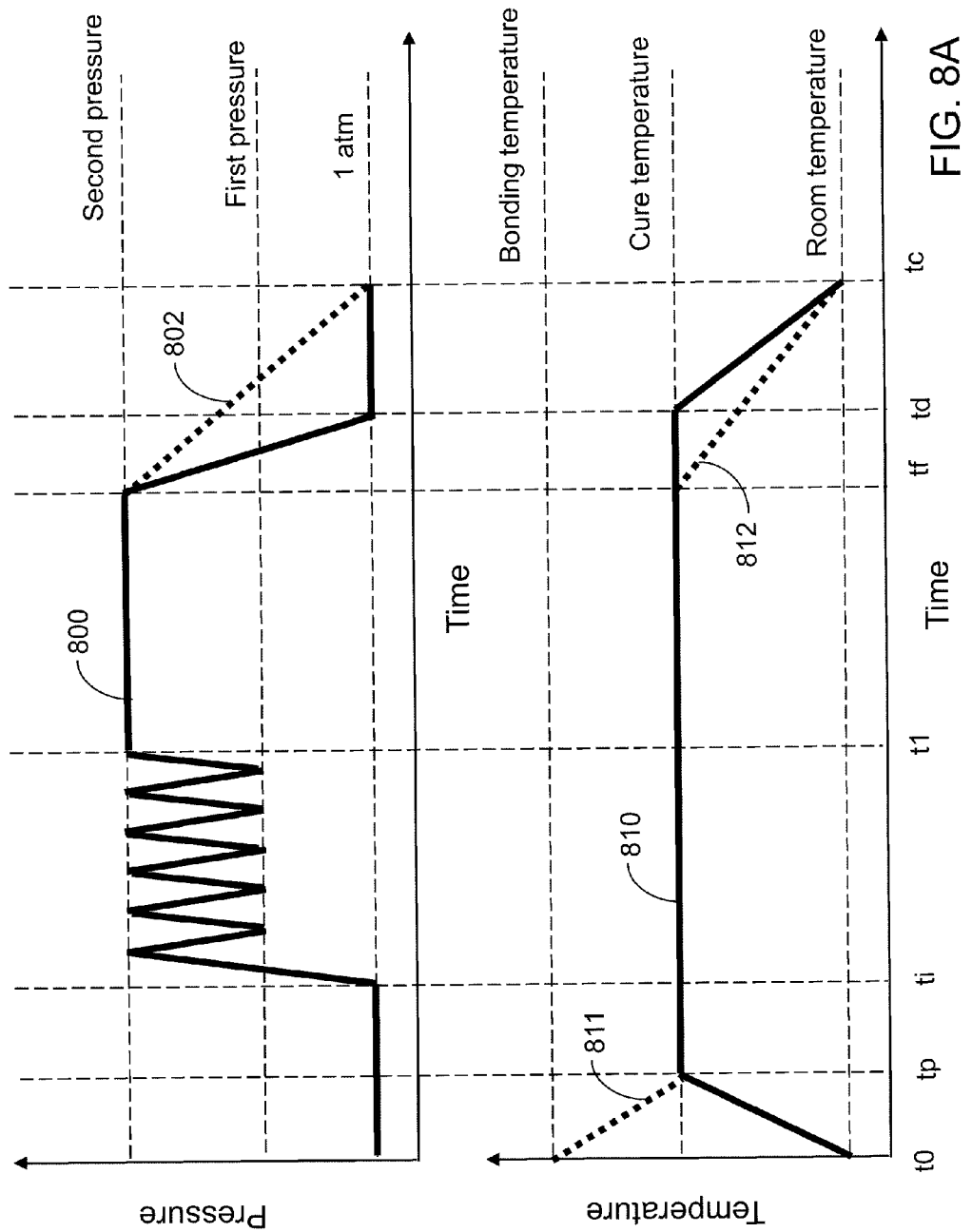
FIG. 8A is a set of graphs illustrating conditions for a fifth cure process according to a fifth embodiment of the present disclosure.

Referring to FIG. 8A, a set of graphs illustrate conditions for a fifth cure process according to a fifth embodiment of the present disclosure. The pressure of the processing conditions is shown in a pressure curve 800, and the temperature of the processing conditions is shown in a temperature curve 810. The temperature of the processing conditions can be modified as shown in an alternate initial temperature curve 811 or any curve between the temperature curve 810 and the alternate initial temperature curve 811. Further, the temperature of the processing conditions can also be modified as shown in an alternate terminal temperature curve 812 or any curve between the temperature curve 810 and the alternate terminal temperature curve 812. The pressure of the processing conditions can be modified as shown in an alternate pressure curve 802 or any curve between the pressure curve 800 and the alternate pressure curve 802.

In the fifth cure process, the constant cure pressure employed in the first cure process is modified to include at least one pressure cycle in addition to, or in lieu of, a constant pressure step. For example, the pressure in the pressurization chamber during the at least one pressure cycle can be ramped up and down repeated between a first pressure and a second pressure that is greater than the first pressure. In each pressure cycle, the underfill material is subjected to a variable pressure between the first cure pressure and the second cure pressure greater than the first pressure. The first pressure can be 1 atm or can be a pressure greater than 1 atm. The second pressure is greater than 1 atm. The first pressure and the second pressure are selected from a pressure range between 1 atm and 25 atm, and typically between 1 atm and 10 atm, although greater pressures can also be employed. The pressure cycling can be, but does not necessarily need to be, followed a constant pressure step. The pressure at the constant pressure step can be the second pressure, or can be a pressure greater or lesser than the second pressure. The effectiveness of the pressure cycling is derived from the forced movement of the incompletely cured underfill material, which includes at least 15% of uncured fraction remaining prior to the final curing. The repeated increase and decrease of the pressure on the underfill material forces the voids to move out of the underfill material while the underfill material maintains some viscosity, i.e., before the underfill material is completely cured, which occurs toward the end of the cure process.

Figure 8B:
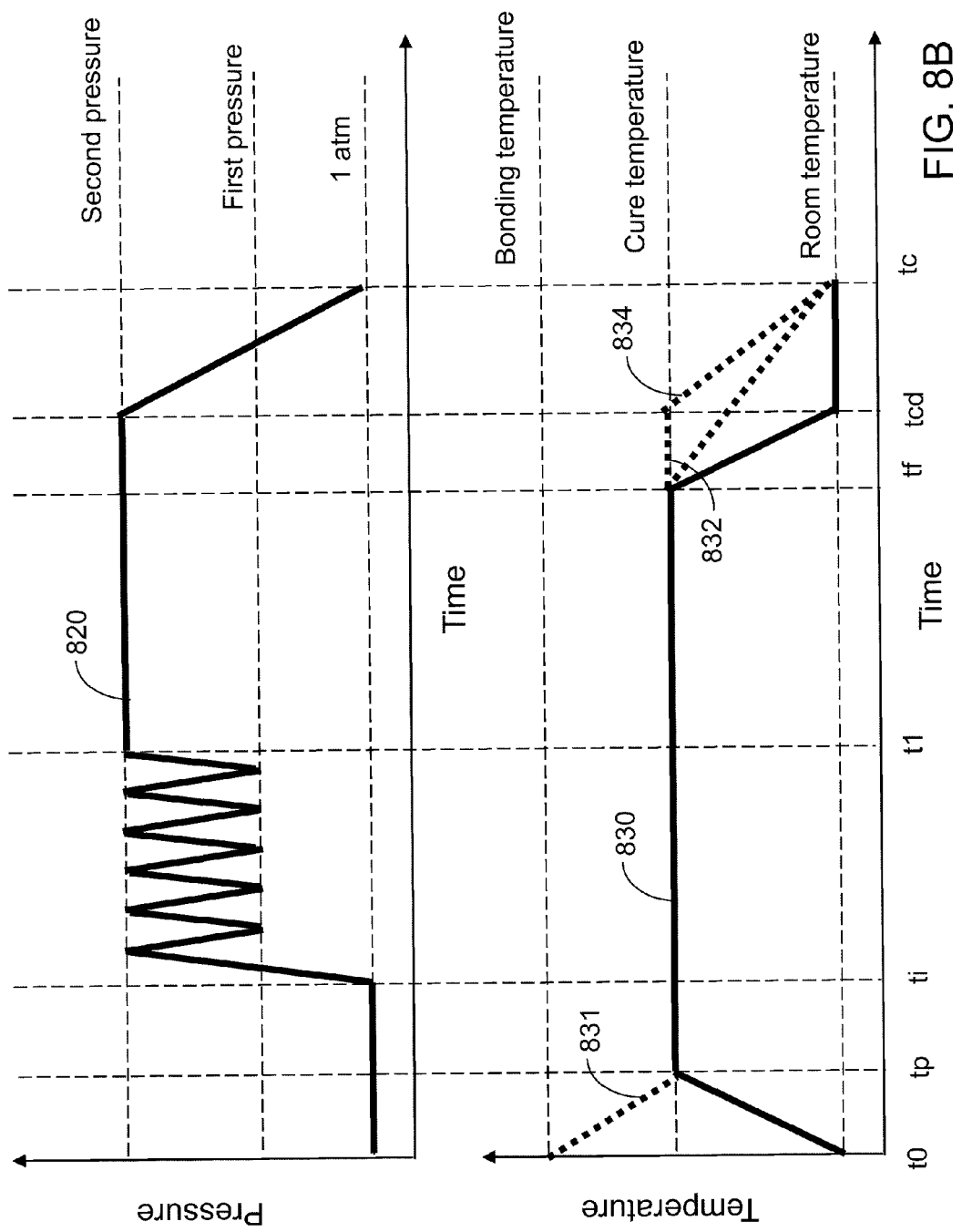
FIG. 8B is a set of graphs illustrating conditions for a variation of the fifth cure process according to the fifth embodiment of the present disclosure.

Referring to FIG. 8B, a set of graphs illustrate conditions for a variation of the fifth cure process according to the fifth embodiment of the present disclosure. The pressure of the processing conditions is shown in a pressure curve 820, and the temperature of the processing conditions is shown in a temperature curve 830. The temperature of the processing conditions can be modified as shown in an alternate initial temperature curve 831 or any curve between the temperature curve 830 and the alternate initial temperature curve 831. Further, the temperature of the processing conditions can also be modified as shown in a first alternate terminal temperature curve 832, in a second alternate terminal temperature curve 834, or any curve between the temperature curve 830 and the second alternate terminal temperature curve 834.

The fifth cure process can be combined with any of the first through fourth cure processes as needed, i.e., to include features such as multi-cure-temperature feature and/or multi-cure-pressure feature. For example, a sixth cure process can employ the pressure profile of the fifth embodiment and the temperature profile of the second or fourth cure process.

Figure 9A:
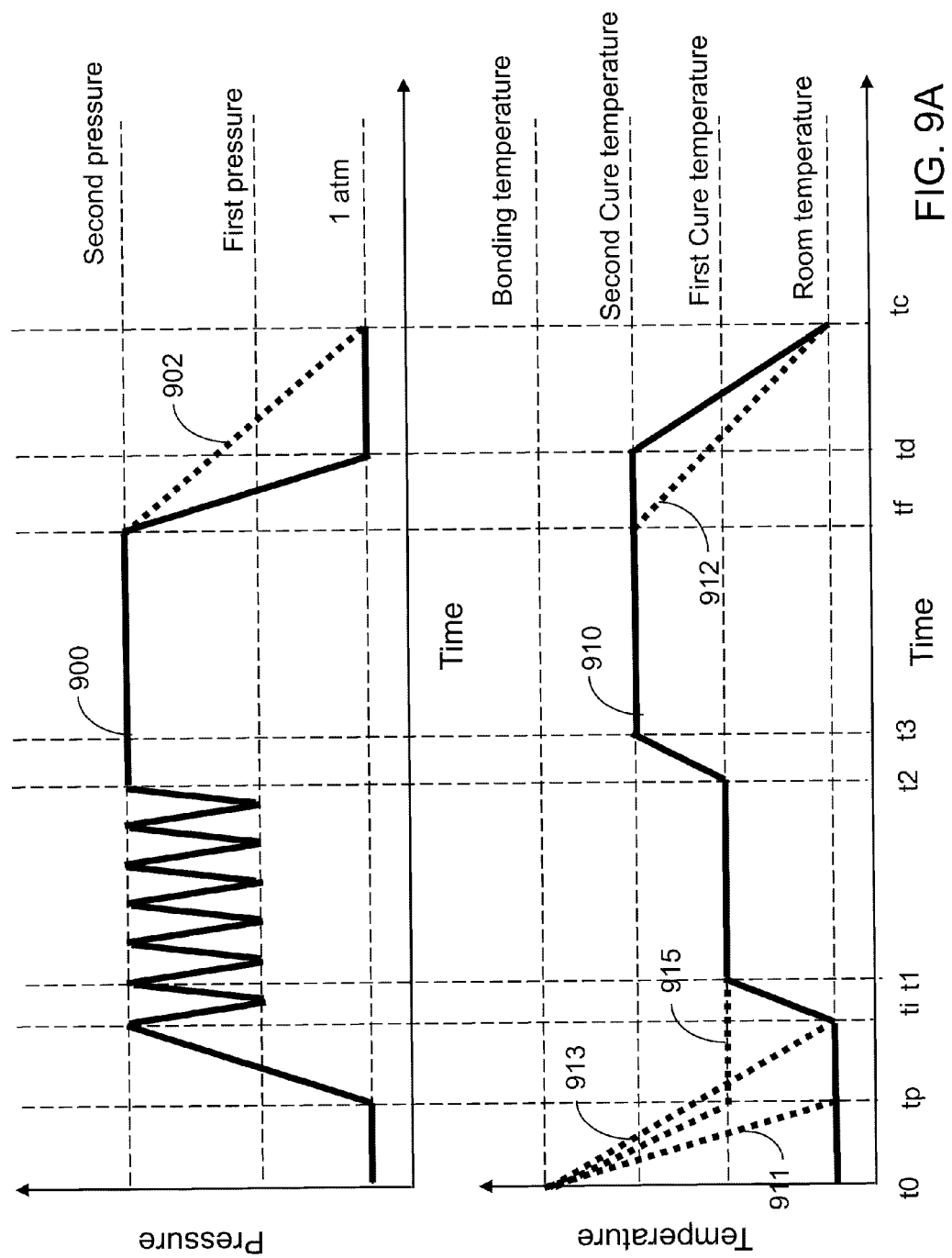
FIG. 9A is a set of graphs illustrating conditions for a sixth cure process according to a sixth embodiment of the present disclosure.

Referring to FIG. 9A, a set of graphs illustrate conditions for the sixth cure process according to a sixth embodiment of the present disclosure. The pressure of the processing conditions is shown in a pressure curve 900, and the temperature of the processing conditions is shown in a temperature curve 910. The temperature of the processing conditions can be modified as shown in an alternate initial temperature curve 911 or any curve between the temperature curve 910 and the alternate initial temperature curve 911. Further, the temperature of the processing conditions can also be modified as shown in an alternate terminal temperature curve 912 or any curve between the temperature curve 910 and the alternate terminal temperature curve 912. The pressure of the processing conditions can be modified as shown in an alternate pressure curve 902 or any curve between the pressure curve 900 and the alternate pressure curve 902. The at least one pressure cycle can achieve the same effect as in the fifth cure process. The underfill material can be subjected to at least one pressure cycles prior to the curing of the underfill material at a cure temperature, e.g., the second cure temperature.

Figure 9B:
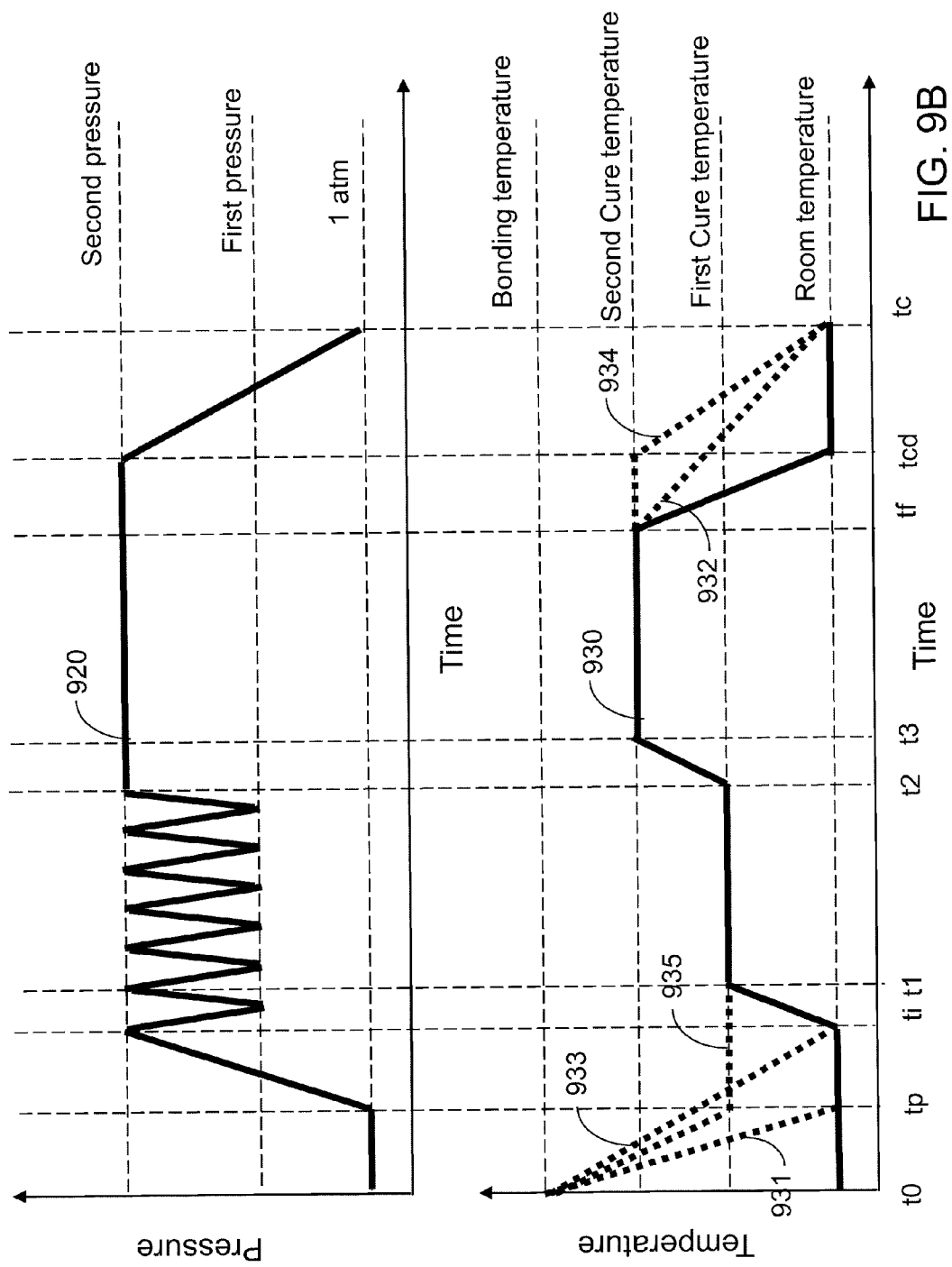
FIG. 9B is a set of graphs illustrating conditions for a variation of the sixth cure process according to the sixth embodiment of the present disclosure.

Referring to FIG. 9B, a set of graphs illustrate conditions for a variation of the sixth cure process according to the sixth embodiment of the present disclosure. The pressure of the processing conditions is shown in a pressure curve 920, and the temperature of the processing conditions is shown in a temperature curve 930. The temperature of the processing conditions can be modified as shown in an alternate initial temperature curve 931 or any curve between the temperature curve 930 and the alternate initial temperature curve 931. Further, the temperature of the processing conditions can also be modified as shown in a first alternate terminal temperature curve 932, in a second alternate terminal temperature curve 934, or any curve between the temperature curve 930 and the second alternate terminal temperature curve 934.

In general, the temperature can be ramped up or down during a pressurized cure step at a constant pressure greater than 1.0 atm or during at least one pressure cycling. For example, the temperature can be ramped up to a cure temperature during at least one pressure cycling in a seventh cure process.

Referring to FIG. 10A, a set of graphs illustrate conditions for the seventh cure process according to a seventh embodiment of the present disclosure. The pressure of the processing conditions is shown in a pressure curve 1000, and the temperature of the processing conditions is shown in a temperature curve 1010. The temperature of the processing conditions can be modified as shown in an alternate initial temperature curve 1011 or any curve between the temperature curve 1010 and the alternate initial temperature curve 1011. Further, the temperature of the processing conditions can also be modified as shown in an alternate terminal temperature curve 1012 or any curve between the temperature curve 1010 and the alternate terminal temperature curve 1012. The pressure of the processing conditions can be modified as shown in an alternate pressure curve 1002 or any curve between the pressure curve 1000 and the alternate pressure curve 1002. The at least one pressure cycle can achieve the same effect as in the fifth cure process.

The underfill material is subjected to a gradual temperature ramp during at least one pressure cycling. The ramp up rate for the temperature can be from 0.3° C./min to 5° C./min, although lesser and greater ramp up rates can also be employed. The gradual ramping of the temperature during the at least one pressure cycle utilizes the relatively high viscosity of the underfill material that is present while a lesser fraction of the underfill material is cured. Further, the underfill material can be subjected to at least one pressure cycles prior to the curing of the underfill material at the cure temperature.

Figure 10B:
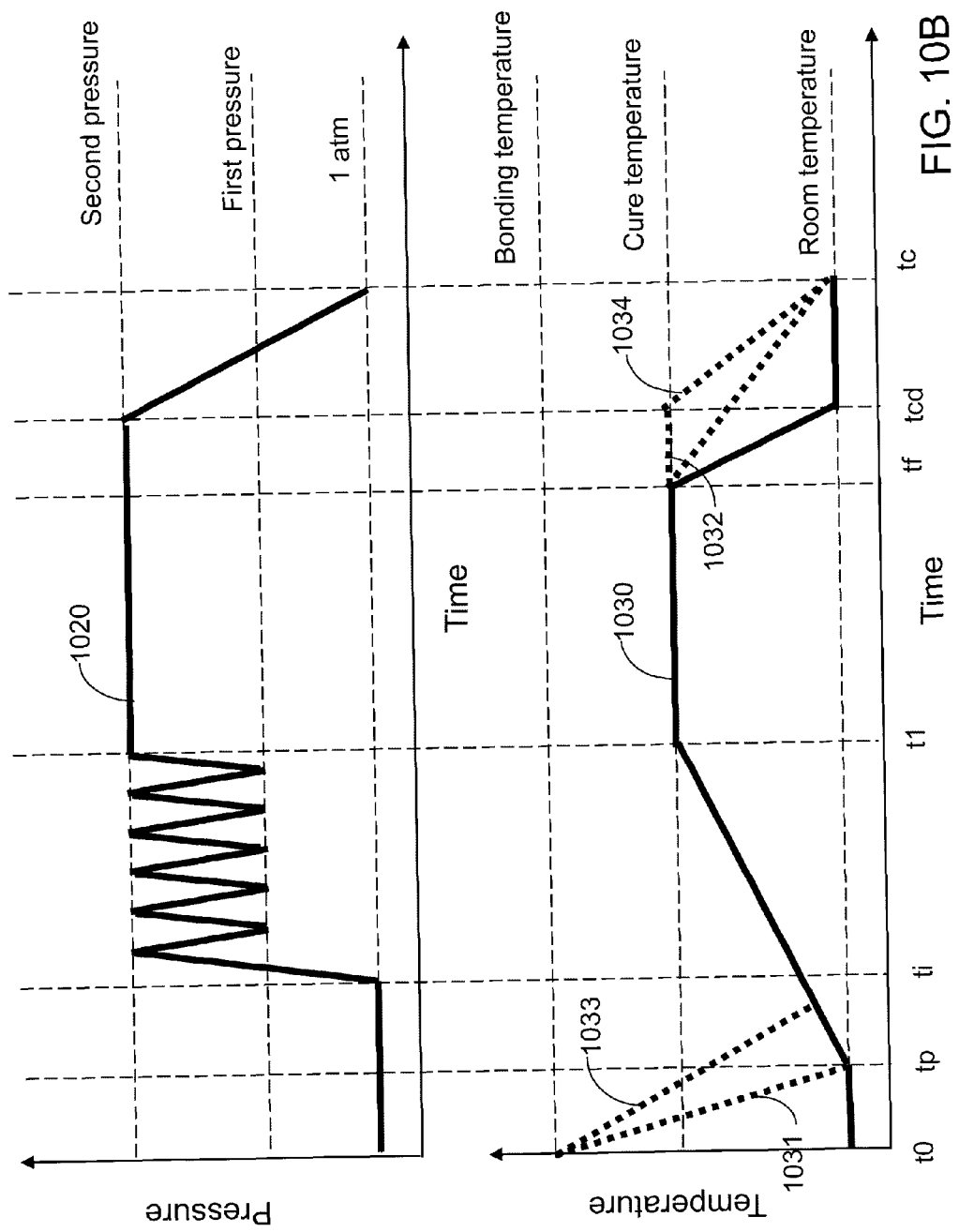
FIG. 10B is a set of graphs illustrating conditions for a variation of the seventh cure process according to the seventh embodiment of the present disclosure.

Referring to FIG. 10B, a set of graphs illustrate conditions for a variation of the seventh cure process according to the seventh embodiment of the present disclosure. The pressure of the processing conditions is shown in a pressure curve 1020, and the temperature of the processing conditions is shown in a temperature curve 1030. The temperature of the processing conditions can be modified as shown in an alternate initial temperature curve 1031 or any curve between the temperature curve 1030 and the alternate initial temperature curve 1031. Further, the temperature of the processing conditions can also be modified as shown in a first alternate terminal temperature curve 1032, in a second alternate terminal temperature curve 1034, or any curve between the temperature curve 1030 and the second alternate terminal temperature curve 1034.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of bonding substrates comprising:
applying an underfill material onto a surface of a first substrate;
placing a second substrate on said underfill material, wherein an array of C4 balls is present between said first substrate and said second substrate;
bonding said first substrate to said second substrate by heating said array of C4 balls to a reflow temperature of said array of C4 balls; and
curing said underfill material at at least one cure temperature greater than room temperature wherein said underfill material is cured in a first steady state at a first cure pressure greater than 1.0 atm and then in a second steady state at a second cure pressure greater than said first cure pressure after said bonding.

2. The method of claim 1, wherein each of said at least one cure temperature is less than a melting temperature of a solder material of said array of C4 balls.

3. The method of claim 1, wherein at least 90% of said underfill material is cured before pressure applied to said underfill material is reduced from said second cure pressure to 1.0 atm.

4. The method of claim 3, wherein at least 99% of said underfill material is cured before pressure applied to said underfill material is reduced from said second cure pressure to 1.0 atm.

5. The method of claim 1, wherein at least 15% of said underfill material is not cured before said curing of said underfill material.

6. The method of claim 1, wherein temperature of said array of C4 balls is ramped up at a rate between 10° C./sec and 100° C./sec from a melting temperature of a solder material of said array of C4 balls to said reflow temperature during said bonding, and is ramped down at a rate between 10° C./sec and 30° C./sec from said reflow temperature to said melting temperature during said bonding.

7. The method of claim 1, wherein said first cure pressure and said second cure pressure are between 1.0 atm and 25 atm.

8. The method of claim 1, wherein a total volume of voids in said underfill material decreases during said curing of said underfill material at said cure temperature.

9. The method of claim 1, wherein said underfill material is applied onto said surface of said first substrate prior to said placing of said second substrate on said underfill material, and said method further comprises bonding said array of C4 balls to an array of bond pads located on said first substrate prior to applying said underfill material to said first substrate.

10. The method of claim 1, wherein said underfill material is applied onto said surface of said first substrate prior to said placing of said second substrate on said underfill material, and said method further comprises bonding said array of C4 balls to an array of bond pads located on said second substrate prior to placing said second substrate on said underfill material.

11. The method of claim 1, wherein said first substrate is a semiconductor chip and said second substrate is a packaging substrate.

12. The method of claim 1, wherein said first substrate is a packaging substrate and said second substrate is a semiconductor chip.

13. The method of claim 1, wherein said first substrate is a first semiconductor chip and said second substrate is a second semiconductor chip.

14. The method of claim 1, wherein said at least one cure temperature is a single cure temperature that remains constant throughout said first steady state and said second steady state.

15. The method of claim 14, wherein said underfill material is cured at said single cure temperature between said first steady state and said second steady state while said first cure pressure is ramped to said second cure pressure.

16. The method of claim 1, wherein at least one cure temperature includes a first cure temperature and a second cure temperature that is greater than said first steady state, and said first steady state is at said first temperature and said second steady state is at said second temperature.

17. The method of claim 16, wherein beginning of ramping down in temperature from said second cure temperature to room temperature and beginning of ramping down from said second cure pressure to 1.0 atm do not coincide in time.

18. A method of bonding substrates comprising:
applying an underfill material onto a surface of a first substrate;
placing a second substrate on said underfill material, wherein an array of C4 balls is present between said first substrate and said second substrate;
bonding said first substrate to said second substrate by heating said array of C4 balls to a reflow temperature of said array of C4 balls; and
curing said underfill material at least one cure temperature greater than room temperature and through at least one pressure cycle in which said underfill material is subjected to a variable pressure between a first cure pressure and a second cure pressure greater than said first cure pressure, wherein said second cure pressure is greater than 1.0 atm.

19. The method of claim 18, wherein said second cure pressure is between 1.0 atm and 25 atm.

20. The method of claim 18, wherein said first cure pressure is greater than 1.0 atm.

21. The method of claim 18, wherein said underfill material is subjected to said at least one pressure cycle prior to said curing of said underfill material at said cure temperature.

22. The method of claim 18, further comprising ramping up a temperature of said underfill material during said at least one pressure cycle.

23. The method of claim 18, wherein said at least one cure temperature is a single cure temperature that remains constant throughout said first steady state and said second steady state.

24. The method of claim 18, wherein at least one cure temperature includes a first cure temperature and a second cure temperature that is greater than said first steady state, and said first steady state is at said first temperature and said second steady state is at said second temperature.

* * * * *